United States Patent
Maeda et al.

(10) Patent No.: US 9,810,734 B2
(45) Date of Patent: Nov. 7, 2017

(54) COMPOUND SENSOR INCLUDING A PLURALITY OF DETECTION ELEMENTS AND A PLURALITY OF FAULT DETECTION CIRCUITS

(71) Applicant: Hitachi Automotive Systems, Ltd., Hitachinaka-shi, Ibaraki (JP)

(72) Inventors: Daisuke Maeda, Tokyo (JP); Ichiroh Ohsaka, Ibaraki (JP); Masahide Hayashi, Ibaraki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/764,067

(22) PCT Filed: Nov. 19, 2013

(86) PCT No.: PCT/JP2013/081204
§ 371 (c)(1),
(2) Date: Jul. 28, 2015

(87) PCT Pub. No.: WO2014/119092
PCT Pub. Date: Aug. 7, 2014

(65) Prior Publication Data
US 2016/0011254 A1    Jan. 14, 2016

(30) Foreign Application Priority Data
Feb. 1, 2013    (JP) ................... 2013-018038

(51) Int. Cl.
*G01R 31/28*    (2006.01)
*G01C 19/5726*    (2012.01)
(Continued)

(52) U.S. Cl.
CPC ..... *G01R 31/2829* (2013.01); *G01C 19/5726* (2013.01); *G01C 19/5776* (2013.01);
(Continued)

(58) Field of Classification Search
CPC ...... B60T 8/885; B60T 8/96; B60T 2270/413; B60W 2710/182; B60W 2050/0295;
(Continued)

(56) References Cited

U.S. PATENT DOCUMENTS 6,476,515 B1 * 11/2002 Yamamoto ............. B60T 7/042
303/122.02
8,360,532 B2 * 1/2013 Nishino ................. B60T 8/442
303/122.03
(Continued)

FOREIGN PATENT DOCUMENTS

JP    8-216900 A    8/1996
JP    2001-124648 A    5/2001
(Continued)

OTHER PUBLICATIONS

International Search Report (PCT/ISA/210) dated Feb. 10, 2014 with English translation (five pages).
(Continued)

*Primary Examiner* — Vinh Nguyen
(74) *Attorney, Agent, or Firm* — Crowell & Moring LLP

(57) ABSTRACT

A compound sensor capable of suppressing a fault which has occurred in a detection element from affecting other detection units in which no fault has occurred is provided. The compound sensor includes: a plurality of detection units including C/V conversion circuits 321a and 321b, amplifier circuits 322a and 322b, ADCs 323a and 323b, diagnosis voltage outputting DACs 327a and 327b, carrier signal generating DACs 328a and 328b and substrate voltage generating DACs 329a and 329b which are signal detection circuits provided for each of a plurality of detection elements; a power source voltage input unit 331 and a GND voltage input unit 332 shared among each of the plurality of detection units; and overcurrent switch circuits 101a and 101b which are fault detection circuits for detecting a fault
(Continued)

of each detection element and stopping power supply to the detection unit in which the fault has occurred.

7 Claims, 10 Drawing Sheets

(51) Int. Cl.
| | |
|---|---|
| *G01P 15/125* | (2006.01) |
| *G01P 15/18* | (2013.01) |
| *G01C 19/5776* | (2012.01) |
| *G01P 21/00* | (2006.01) |
| *G01R 31/02* | (2006.01) |
| *G01P 15/08* | (2006.01) |

(52) U.S. Cl.
CPC ............ *G01P 15/125* (2013.01); *G01P 15/18* (2013.01); *G01P 21/00* (2013.01); *G01R 31/025* (2013.01); *G01P 2015/0814* (2013.01)

(58) Field of Classification Search
CPC ... B60W 20/50; B60W 50/038; B62D 15/025; G06F 11/008; G06F 1/266; G06F 1/28; G06F 1/3215; G06F 1/3287; G06F 1/3296; H02P 29/027; H02P 29/032; H02P 9/102; G01P 15/125; G01P 15/18; G01P 2015/0814; G01P 21/00; G01R 31/025; G01R 31/2829

See application file for complete search history.

(56) References Cited

U.S. PATENT DOCUMENTS

| | | | |
|---|---|---|---|
| 8,427,177 | B2 | 4/2013 | Jeong et al. |
| 2009/0126491 | A1 | 5/2009 | Yamanaka et al. |
| 2013/0226506 | A1 | 8/2013 | Nakamura et al. |
| 2013/0312517 | A1 | 11/2013 | Jeong et al. |

FOREIGN PATENT DOCUMENTS

| | | |
|---|---|---|
| JP | 2009-145321 A | 7/2009 |
| JP | 2011-95104 A | 5/2011 |
| JP | 4793012 B2 | 10/2011 |
| JP | 2012-93301 A | 5/2012 |
| JP | 2012-168097 A | 9/2012 |

OTHER PUBLICATIONS

Japanese-language Written Opinion (PCT/ISA/237) dated Feb. 10, 2014 (four pages).

* cited by examiner

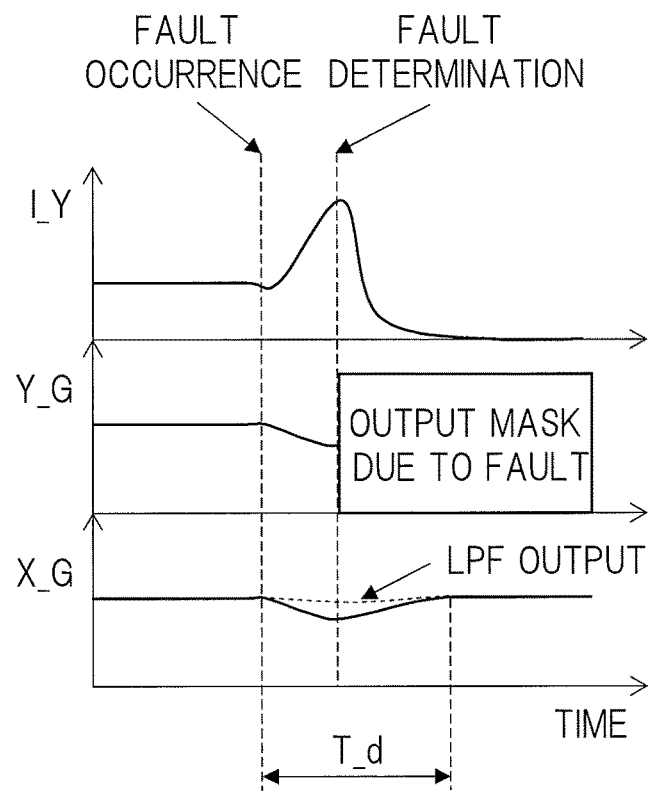

FIG. 10A

| YAW    | XG     | YG     | DIAG   |
|--------|--------|--------|--------|
| 0x0120 | 0x0200 | 0xFE00 | 0x0000 |

FIG. 10B

| YAW    | XG     | YG     | DIAG   |
|--------|--------|--------|--------|
| 0x8000 | 0x0200 | 0xFE00 | 0x0404 |

COMPOUND SENSOR INCLUDING A PLURALITY OF DETECTION ELEMENTS AND A PLURALITY OF FAULT DETECTION CIRCUITS

TECHNICAL FIELD

The present invention relates to a compound sensor for detecting a plurality of physical quantities, and it particularly relates to a compound sensor having a function of detecting occurrence of faults in detection elements of the physical quantities and a function of preventing influences of the faults from spreading to other detection units.

BACKGROUND ART

As a background art in this technical field, for example, Patent Document 1 has been known. Patent Document 1 describes a technology including redundant angular velocity sensors. More specifically, the paragraph [0011] of Patent Document 1 describes that a plurality of angular velocity sensors having a fault diagnosis circuit which outputs fault signals at the time of faults, discrimination means which determines presence or absence of faults of the angular velocity sensors and a faulty angular velocity sensor and step-voltage output means which changes fault signals in a stepwise manner based on output signals from the discrimination means are provided, and output signals of the angular velocity sensors other than the faulty angular velocity sensor are transmitted to an external computer.

Further, Patent Document 2 and Patent Document 3 are also known as background arts in this technical field. Patent Documents 2 and 3 describe the technologies of sharing a detecting circuit among a plurality of axes. More specifically, the following contents are described. That is, the paragraph [0025] of Patent Document 2 which explains FIG. 1 thereof describes that a diagnosis voltage control unit 167 forcibly displaces an oscillator 128 in an X axis direction and an oscillator 129 in a Y axis direction and applies a voltage to electrodes 131 and 133 in order to diagnose whether an acceleration sensor is operating properly. Further, FIG. 11 of Patent Document 3 describes that a carrier wave application circuit 18 applies carrier waves to variable capacitors 21a, 21b, 22a and 22b with having orthogonal sensitivities (detection axes).

RELATED ART DOCUMENTS

Patent Documents

Patent Document 1: Japanese Patent No. 4,793,012
Patent Document 2: Japanese Patent Application Laid-Open Publication No. 2012-93301
Patent Document 3: Japanese Patent Application Laid-Open Publication No. 2009-145321

SUMMARY OF THE INVENTION

Problems to be Solved by the Invention

Sensor devices of a type referred to as MEMS (Micro Electro Mechanical Systems) utilizing semiconductor technologies for detecting inertial quantities have been developed, and have gradually been applied particularly to the field of automobiles. Further, the so-called "compounding" for realizing the detection of a plurality of physical quantities with a single sensor module or a single detection element chip has been progressing, and movements for achieving the cost reductions of sensor have been promoted.

For instance, such a compound sensor has a configuration shown in FIG. 11. FIG. 11 is a diagram showing one example of an overall configuration of a compound sensor studied as a premise of the present invention. FIG. 11 shows a configuration example of a biaxial acceleration sensor, namely, a compound acceleration sensor including two detection elements such as a first acceleration detection element and a second acceleration detection element.

In this compound acceleration sensor, a first acceleration detection element and a second acceleration detection element are provided in an acceleration detection element chip 311. The first acceleration detection element includes a first movable part 312a which is displaced by an acceleration and first detection electrodes 313a which forma capacitor together with a fixed part which is not displaced with respect to the movable part 312a and detect an acceleration, and the second acceleration detection element includes a second movable part 312b which is displaced by an acceleration and second detection electrodes 313b which form a capacitor together with a fixed part which is not displaced with respect to the movable part 312b and detect an acceleration. Further, the first acceleration detection element includes the movable part 312a and first diagnosis electrodes 314a which form a capacitor together with the fixed part which is not displaced with respect to the movable part 312a and forcibly displace the movable part 312a by an electrostatic force, and the second acceleration detection element includes the movable part 312b and second diagnosis electrodes 314b which forma capacitor together with the fixed part which is not displaced with respect to the movable part 312b and forcibly displace the movable part 312b by an electrostatic force. Moreover, first and second carrier voltage application parts 315a and 315b for supplying carrier voltage to the respective detection electrodes 313a and 313b are provided. In addition, first and second support beams 317a and 317b for supporting the movable parts 312a and 312b and a dummy pattern part 316 which is a region other than the movable parts and the fixed parts are provided.

Further, a signal detection LSI 320 includes first and second C/V (capacitance to voltage) conversion circuits 312a and 321b, first and second amplifier circuits 322a and 322b and first and second ADCs (analog to digital convertors) 323a and 323b for the detection elements, respectively. A first detection unit is constituted of the above-described first acceleration detection element and its detection circuits (the first C/V conversion circuit 312a, the first amplifier circuit 322a and the first ADC 323a), and a second detection unit is constituted of the above-described second acceleration detection element and its detection circuits (the second C/V conversion circuit 321b, the second amplifier circuit 322b and the second ADC 323b). Further, the signal detection LSI 320 is provided with a reference voltage generation circuit 324, an oscillator and clock generation circuit 325, a memory 326 such as an EPROM (Erasable Programmable Read Only Memory), a ROM (Read Only Memory), a RAM (Random Access Memory) or register, a diagnosis voltage outputting DAC (Digital To Analogue Converter) 327, a carrier signal generating DAC 328, a substrate voltage generating DAC 329, a DSP (Digital Signal Processor) circuit unit 330, a power source voltage input unit 331 and a GND voltage input unit 332, and the numbers of these components are less than the number of the detection elements. More specifically, only one set of these components is provided in general. The reason therefor will be described later.

Also, the acceleration detection element chip 311 and the signal detection LSI 320 are electrically connected by bonding wires 341.

Operations of the compound acceleration sensor having the above-described configuration will be described. In the signal detection LSI 320 of the compound acceleration sensor, power source voltage from outside is received by the power source voltage input unit 331 and the GND voltage input unit 332. The received power source voltage is then supplied to each of the first C/V conversion circuit 321a, the first amplifier circuit 322a, the first ADC 323a, the second C/V conversion circuit 321b, the second amplifier circuit 322b, the second ADC 323b, the diagnosis voltage outputting DAC 327, the carrier signal generating DAC 328, the substrate voltage generating DAC 329, the reference voltage generation circuit 324, the oscillator and clock generation circuit 325, the memory 326 and the DSP circuit unit 330, which are the circuit elements shown in FIG. 11.

Also, the reference voltage generation circuit 324 has a function of generating a predetermined constant voltage level with suppressed fluctuations due to power source voltage or temperature. Such a reference voltage has a function of determining the sensitivity of the sensor as a reference voltage of the ADC and DAC. The reference voltage generated by the reference voltage generation circuit 324 is supplied to the first ADC 323a, the second ADC 323b, the diagnosis voltage outputting DAC 327, the carrier signal generating DAC 328 and the substrate voltage generating DAC 329. Since the reference voltage generation circuit 324 is shared among the detection units even in a compound acceleration sensor as described above, a configuration having only one reference voltage generation circuit can be adopted. Such a configuration makes it possible to achieve the size reduction of the signal detection LSI 320 and the reduction of manufacturing costs.

The carrier signal generating DAC 328 receives clock triggers from the oscillator and clock generation circuit 325 and applies carrier signals, which are obtained by adjusting the reference voltage to a predetermined voltage by voltage dividing or the like, to the carrier voltage application parts 315a and 315b. At this time, the carrier signal generating DAC 328 and the oscillator and clock generation circuit 325 are shared among a plurality of detection units for the same reasons as that of the reference voltage generation circuit 324.

In the acceleration detection element chip 311, when an acceleration is applied, the movable parts are displaced to change relative distances with respect to the fixed parts, that is, the electrostatic capacitances of the detection electrodes 313a and 313b change. The amounts of change of electrostatic capacitances of the detection electrodes 313a and 313b to which carrier signals are applied are input to the C/V conversion circuits 321a and 321b in the form of current and are converted into voltage signals. The acceleration converted into voltage signals is output to an upper system through communication means (Comm.) such as SPI (Serial Peripheral Interface) communication after passing through the amplifier circuits 322a and 322b and the ADCs 323a and 323b and being subjected to waveform shaping by the DSP circuit unit 330, for example, noise reduction by a low pass filter (LPF) and trimming (TRIM.) adjustment of zero points or gains.

At this time, the DSP circuit unit 330 and the memory 326 are shared among the detection units for the same reason as that of the reference voltage generation circuit 324. However, as for the C/V conversion circuits 321a and 321b, the amplifier circuits 322a and 322b and the ADCs 323a and 323b, it is necessary to provide them as many as the number of the detection elements because these are the circuits for processing voltage signals of continuous time and are thus difficult to be shared among other detection units. Further, the diagnosis voltage outputting DAC 327 is also shared among the detection units. The diagnosis voltage outputting DAC 327 detects faults such as fixed adhesion by generating electrostatic force by applying voltage to the diagnosis electrodes 314a and 314b of the detection elements and confirming the occurrence of displacement by the DSP circuit unit 330.

Further, the substrate voltage generating DAC 329 is also shared among the detection units. The substrate voltage is a voltage of the dummy pattern part 316. Particularly, by setting the substrate voltage to be equal to the voltage of the movable parts 312a and 312b, it is possible to suppress occurrence of unnecessary electrostatic force generated between the movable parts 312a and 312b and the dummy pattern part 316 and to suppress influences of parasitic capacitance. Accordingly, it is desirable that even the dummy pattern part 316, which is a conductive body which is not directly necessary for detecting acceleration and does not constitute electrodes for realizing a sensor function, has a function of fixing its voltage to a constant value instead of leaving it in a floating state. However, as for the voltage of the dummy pattern part, that is, the substrate voltage, it is sufficient if the same voltage is applied to all of the detection elements as described above, and it is thus possible to share the substrate voltage generating DAC 329 among the detection units.

Further, as shown in FIG. 11, when the dummy pattern part 316 on the chip of the acceleration detection element chip 311 is a conductive body common to all detection elements and it is not configured to separate voltages, it is apparently necessary and sufficient to provide a single substrate voltage generating DAC 329 on the side of the signal detection LSI 320. With the configuration described above, in an acceleration sensor having a plurality of detection elements, the parts capable of being shared are used in common as much as possible on the side of the signal detection LSI, so that the compound sensor capable of achieving the reduction of manufacturing cost can be realized. Accordingly, the compound sensor has the configuration described above in general.

Further, from the viewpoint of improving fault tolerance, it is also possible to employ the configuration in which a plurality of movable parts 312a and 312b shown in FIG. 11 are provided to have the same physical quantity and the same detection axis (not shown). More specifically, this is a concept of a redundant sensor in which, by providing a number of exactly the same detection elements, even when one detection element has a fault, other detection elements having no fault can maintain the desired sensor function. A technology using such a concept is, for instance, the above-described Patent Document 1.

Considering the probability of fault occurrence in the signal detection LSI 320 and the acceleration detection element chip 311 shown in FIG. 11, the former is in a so-called solid state and has no mechanical movable part and is thus excellent in shock resistance, while the latter is configured to have minute mechanical structures which are constantly displaced by acceleration or electrostatic force. Namely, the fault occurrence rate of the signal detection LSI is generally remarkably lower when compared to that of the acceleration detection element chip. Also, even when compared to contact faults or short circuits of bonding wires to connect them, the fault occurrence rate of the signal detection LSI itself is generally remarkably low. Therefore, even when the configuration of a redundant sensor is employed for the purpose of improving fault tolerance, the signal detection LSI generally has the configuration in which circuit elements capable of being shared are used in common as much as possible like in the above-described acceleration sensor for detecting biaxial acceleration. Otherwise, it is no different from the case where a plurality of the same sensors are provided on the same detection axis, and no merits can be achieved in terms of costs.

For instance, the above-described Patent Document 1 also describes a configuration in which a plurality of angular velocity sensors are provided in a redundant sensor and one circuit having means for detecting faults thereof and selecting outputs is provided in the redundant sensor. More specifically, it can be said that compound sensors and redundant sensors are configured on the premise that circuit units hardly fail while acceleration sensor parts having mechanical structures might fail. In other words, there is an understanding that the probability of occurrence of simultaneous faults of a plurality of circuit units of the same sensor and the probability of occurrence of one fault of a sensor circuit unit having a plurality of detection elements can be considered to be substantially the same when compared to those of the mechanical structure part and the bonding wire part.

Further, the above-described Patent Document 2 and Patent Document 3 also describe a technology of sharing detection circuits among a plurality of axes in consideration of advantages in terms of cost of redundant sensors. For instance, a diagnosis voltage control unit is used in common in the Patent Document 2 and a carrier wave application circuit is used in common in the Patent Document 3 so as to have the configurations capable of obtaining the advantages in terms of cost.

Incidentally, as a result of the studies by the inventors of the present invention on the prior arts including the above-described Patent Documents 1 to 3, the followings have been found. Namely, configurations of the prior art have the problem that it is not possible to prevent a fault of one detection element, in particular, a mechanical fault of a detection element unit from spreading to other detection units. This problem will be described below.

The above-described acceleration detection element chip 311 shown in FIG. 11 has a minute mechanical structure made of a material such as silicon and fabricated by etching processing technologies such as DRIE (Deep Reactive Ion Etching). In the mechanical structure obtained by the microfabrication like this, the mass of the movable parts generally ranges from approximately several micrograms to several hundreds of micrograms, and thus the electric electrostatic force is sometime dominant to the displacement thereof.

For instance, when a large displacement is caused due to the application of extremely large acceleration from outside (for instance, a situation in which the sensor drops and hits the ground), a fault mode in which movable parts fixedly adhere to a fixed part of the electrode or the dummy pattern part by floating electric charge may occur in some cases. Further, if conductive particles are generated for some reasons or enter from outside during fabrication, an electrical short circuit condition is caused when the particles adhere between conductive bodies with different voltages. As described above, since all of the conductive bodies of the acceleration detection element chip 311 are not in a floating state but some kind of voltage is given thereto in general, current flows when there is a difference in their voltages.

A fault mode of short circuits caused by falling off or mutual contact of bonding wires might also occur for the structural reasons of the sensor. Also in this case, current different from the current amount intended at the time of designing is generated due to the voltage difference.

Due to these short circuits, the acceleration detection element part and the bonding wire part, which are the load sides when seen from the signal detection LSI, come into a low-impedance state, resulting in a situation different from that supposed at the time of designing the circuit. At this time, the fault mode in which voltage or current which is not input within the range of normal operation is input is caused in the first and second C/V conversion circuits 321*a* and 321*b*, the first and second amplifier circuits 322*a* and 322*b* and the first and second ADCs 323*a* and 323*b*. Consequently, faults that an excessive current is made to flow from a power source and a permissible current amount in the reference voltage generation circuit 324 is exceeded occur.

When such an overcurrent is generated, for example, voltage drop due to output resistance of the power source circuit and the reference voltage generation circuit 324 occurs, and the output voltage of the reference voltage generation circuit is changed to the value different from the originally designed voltage value. Particularly, since the reference voltage serves as a reference voltage for the respective elements of the detection circuits as described above, the change in the reference voltage due to short circuit of one detection element frequently causes defect modes such as offset drift and sensitivity change of other detection units in which no fault occurs.

Here, FIG. 12 shows an example of a C/V conversion circuit which detects acceleration by the change in electrostatic capacitance Cs. In FIG. 12, 2001 denotes a switch, 2002 denotes an output terminal, 2003 denotes a carrier signal generator having a voltage amplitude (carrier voltage) Vc, 2004 denotes a bias voltage and 2005 denotes an operational amplifier. In this C/V conversion circuit, an acceleration output Vout occurring at the output terminal 2002 is expressed by the relation of Vout=Cs/Cf×Vc by using feedback capacitance Cf. Further, since the carrier voltage is generated by dividing the reference voltage for achieving accuracy, the change in the reference voltage will change the carrier voltage Vc. Accordingly, when the reference voltage changes, it is detected as the change in the electrostatic capacitance Cs by an upper system even though there is no change in the electrostatic capacitance Cs for detecting the acceleration, and a fault mode in which the output of the sensor is fluctuated by the change of the carrier voltage Vc is caused.

More specifically, there is a risk that a fault of a certain detection element may spread to other detection units having no fault. Further, since the voltage of the circuit network becomes different from that intended at the time of design due to the occurrence of short circuit or overcurrent described above, the interactions by parasitic capacitance and parasitic resistance in the circuit also become different from those at the time of design. For instance, there is a possibility that a parasitic capacitance, which has not been found because conductive bodies have the same voltage, appears as a parasitic capacitance when one conductive body falls to a ground level, so that a distortion is caused in the rise of a carrier signal and a voltage is applied to a conductive body which should originally be at the ground level, with the result that the ground level of the entire circuit is fluctuated. These phenomena also have the risk that defect modes such as offset drift and sensitivity change of sensor outputs spread to detection units in which no fault has occurred.

The present invention has been made for solving the problems above, and a typical object thereof is to provide a technology capable of suppressing a fault which has occurred in a certain detection element from affecting other detection units in which no fault has occurred in a compound sensor including a plurality of detection elements or redundant detection elements.

The above and other objects and novel characteristics of the present invention will be apparent from the description of the present specification and the accompanying drawings.

Means for Solving the Problems

The following is a brief description of an outline of the typical invention disclosed in the present application.

More specifically, a typical compound sensor is a compound sensor including a plurality of detection elements for detecting a plurality of physical quantities. The compound sensor includes: a plurality of detection units made up of signal detection circuits provided for each of the plurality of detection elements; a power source shared among each of the plurality of detection units; and a plurality of fault detection circuits provided for each of the plurality of detection units for detecting a fault of each detection element and stopping power supply to a faulty detection unit.

The effects obtained by typical embodiments of the invention disclosed in the present application will be briefly described below.

Effects of the Invention

Namely, by the typical effect of the present invention, it is possible to suppress a fault which has occurred in a certain detection element from affecting other detection units in which no fault has occurred in a compound sensor including a plurality of detection elements or redundant detection elements.

BRIEF DESCRIPTIONS OF THE DRAWINGS

FIG. 5 is a diagram showing one example of the change in sensor output at the time of occurrence of fault on a time axis in the compound sensor shown in FIG. 1;

FIG. 6A and FIG. 6B are diagrams showing one example of sensor output formats at the time of normal state and at the time of occurrence of fault in the compound sensor shown in FIG. 1;

FIG. 10A and FIG. 10B are diagrams showing one example of sensor output formats at the time of normal state and at the time of occurrence of fault in the compound sensor shown in FIG. 9;

DETAILED DESCRIPTION OF PREFERRED EMBODIMENTS

Figure 1:
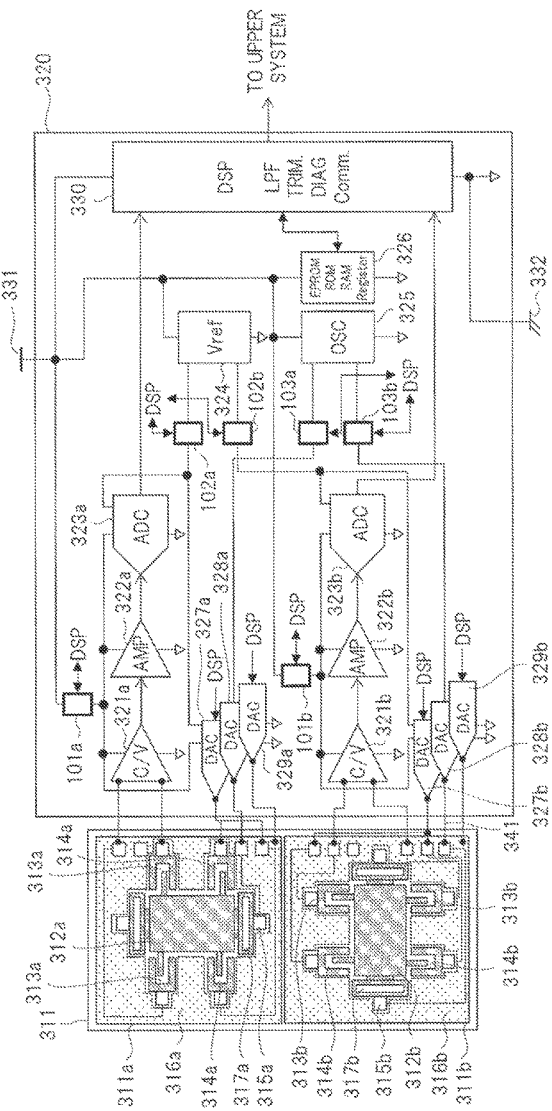
FIG. 1 is a diagram showing one example of an overall configuration of a compound sensor according to the first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Outline of Embodiments

First, outline of the embodiments will be described. In the outline of the present embodiments, descriptions will be made while affixing corresponding components and reference characters in respective embodiments in brackets.

A typical compound sensor of the embodiments is a compound sensor including a plurality of detection elements for detecting a plurality of physical quantities (first embodiment: first and second acceleration detection elements 311a and 311b, second embodiment: first and second acceleration detection elements 311a and 311b and first angular velocity detection element 1013a). The compound sensor includes: a plurality of detection units made up of signal detection circuits provided for each of the plurality of detection elements (C/V conversion circuits 321a, 321b, 1001 and 1004, amplifier circuits 322a, 322b, 1002 and 1005, ADCs 323a, 323b, 1003 and 1006, diagnosis voltage outputting DACs 327a and 327b, carrier signal generating DACs 328a, 328b and 1008, substrate voltage generating DACs 329a, 329b and 1009 and driving voltage generating DAC 1007); a power source (power source voltage input unit 331 and GND voltage input unit 332) shared among each of the plurality of detection units; and a plurality of fault detection circuits (overcurrent switch circuits 101a, 101b and 104) which are provided for each of the plurality of detection units for detecting faults of the detection elements and stopping the power supply to the detection unit in which a fault has occurred.

More preferably, the compound sensor includes a reference voltage generation circuit (reference voltage generation circuit 324) and a clock generation circuit (oscillator and clock generation circuit 325) shared among each of the plurality of detection units. Further, each of the plurality of fault detection circuits (overcurrent switch circuits 102a, 102b, 103a, 103b and 105 to 107) includes a buffer circuit (operational amplifier 701). Then, at least one of the voltage signal of the reference voltage generated by the reference voltage generation circuit and the clock voltage signal generated by the clock generation circuit is supplied to the detection units via each of the plurality of buffer circuits.

Figure 11:
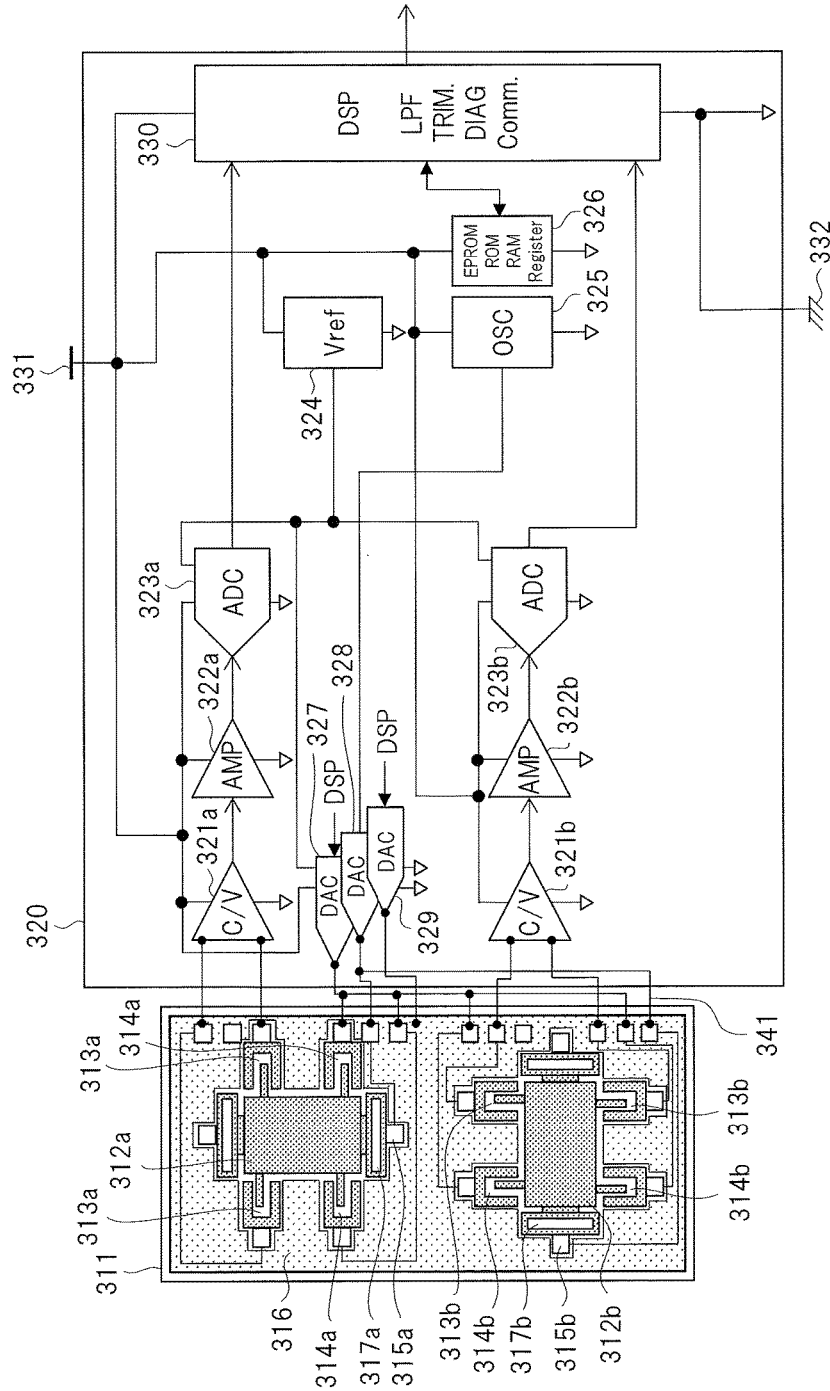
FIG. 11 is a diagram showing one example of an overall configuration of a compound sensor studied as a premise of the present invention.
Figure 12:
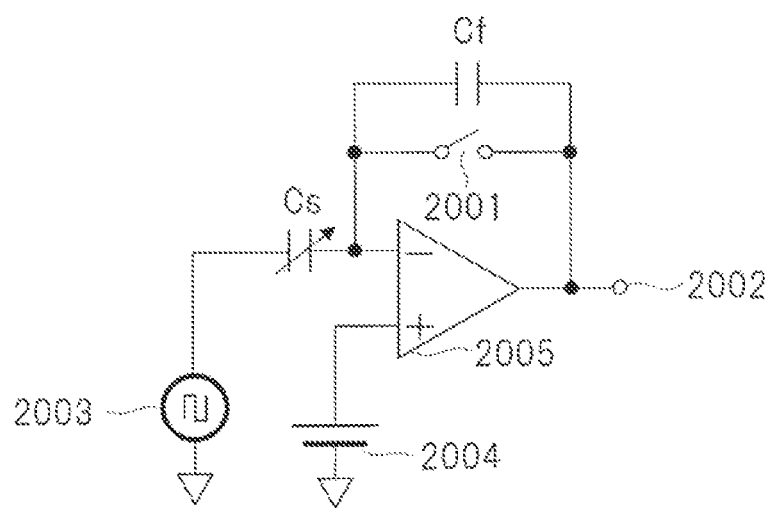
FIG. 12 is a diagram showing one example of a configuration of a C/V conversion circuit for detecting acceleration based on a change in electrostatic capacitance in the description of the problems to be solved by the present invention.

Hereinafter, embodiments based on the above-described outline of the embodiments will be described in detail with reference to the accompanying drawings. Note that he same components are denoted by the same reference characters throughout the drawings for describing the embodiments, and the repetitive description thereof will be omitted. Further, since members identical to those of FIG. 11 studied as a premise of the present invention are also denoted by the same reference characters, repetitive descriptions thereof will be omitted.

In the present embodiments, descriptions will be made based on the examples of a compound sensor for realizing biaxial acceleration detection (first embodiment) and a compound sensor for realizing biaxial acceleration detection and uniaxial angular velocity detection (second embodiment). The technology shown in this specification is not necessarily limited to the configurations described above, and it is widely applicable to overall compound sensors configured to have multiple detection axes and configured to detect physical quantities other than acceleration and angular velocity.

Further, the present embodiments relate to a configuration of a compound sensor applied with the so-called functional safety characterized by having a function of detecting occurrence of faults in detection elements of physical quantities and a function of preventing influences of the faults from spreading to other detection units. Namely, the present embodiments can realize a sensor applied with the so-called functional safety capable of solving the problem that a fault which has occurred in a certain detection element, in particular, occurrence of large current due to a short circuit affects other detection units having no fault in a compound sensor including a plurality of detection elements or redundant detection elements in which functions of a signal detection LSI are partially shared.

First Embodiment

The compound sensor according to the first embodiment will be described with reference to FIG. 1 to FIG. 8.
<Configuration and Operation of Compound Sensor>
First, the configuration of the compound sensor according to the present embodiment will be described with reference to FIG. 1. FIG. 1 is a diagram showing one example of an overall configuration of the compound sensor. In the present embodiment, a configuration example of a compound sensor for biaxial acceleration, namely, a compound sensor including two acceleration detection elements of a first acceleration detection element and a second acceleration detection element will be described.

The compound sensor of FIG. 1 is configured to include an acceleration detection element chip 311 and a signal detection LSI 320.

The acceleration detection element chip 311 includes a first acceleration detection element 311a and a second acceleration detection element 311b. The first acceleration detection element 311a includes a first movable part 312a which is displaced by an acceleration and first detection electrodes 313a which form a capacitor together with a fixed part which is not displaced with respect to the movable part 312a and detect an acceleration, and the second acceleration detection element 311b includes a second movable part 312b which is displaced by an acceleration and second detection electrodes 313b which form a capacitor together with a fixed part which is not displaced with respect to the movable part 312b and detect an acceleration. Further, the first acceleration detection element 311a includes the movable part 312a and first diagnosis electrodes 314a which form a capacitor together with the fixed part which is not displaced with respect to the movable part 312a and realize a function of applying a voltage to forcibly displace the movable part 312a by an electrostatic force, and the second acceleration detection element 311b includes the movable part 312b and second diagnosis electrodes 314b which forma capacitor together with the fixed part which is not displaced with respect to the movable part 312b and realize a function of applying a voltage to forcibly displace the movable part 312b by an electrostatic force. Moreover, first and second carrier voltage application parts 315a and 315b for supplying carrier voltage to the respective detection electrodes 313a and 313b are provided in the first and second acceleration detection elements 311a and 311b, respectively. In addition, first and second support beams 317a and 317b for supporting the movable parts 312a and 312b and first and second dummy pattern parts 316a and 316b which are regions other than the movable parts and the fixed parts are provided in the first and second acceleration detection elements 311a and 311b, respectively.

The signal detection LSI 320 includes first and second C/V conversion circuits 321a and 321b, first and second amplifier circuits 322a and 322b, first and second ADCs 323a and 323b, first and second diagnosis voltage outputting DACs 327a and 327b, first and second carrier signal generating DACs 328a and 328b and first and second substrate voltage generating DACs 329a and 329b for each of the detection elements. A first acceleration detection unit is constituted of the above-described first acceleration detection element 311a and its detection circuits (the first C/V conversion circuit 321a, the first amplifier circuit 322a, the first ADC 323a, the first diagnosis voltage outputting DAC 327a, the first carrier signal generating DAC 328a and the first substrate voltage generating DAC 329a) and a second acceleration detection unit is constituted of the above-described second acceleration detection element 311b and its detection circuits (the second C/V conversion circuit 321b, the second amplifier circuit 322b, the second ADC 323b, the second diagnosis voltage outputting DAC 327b, the second carrier signal generating DAC 328b and the second substrate voltage generating DAC 329b). Further, the signal detection LSI 320 is provided with a reference voltage generation circuit 324, an oscillator and clock generation circuit 325, a memory 326 such as an EPROM, a ROM, a RAM or register, a DSP circuit unit 330, a power source voltage input unit 331 and a GND voltage input unit 332, and the numbers of these components are less than the number of the detection elements. More specifically, only one set of these components is provided in general. The reason therefor has been described above.

Also, the acceleration detection element chip 311 and the signal detection LSI 320 are electrically connected by bonding wires 341.

Operations of the compound sensor configured as described above will be described. In the signal detection LSI 320 of the compound sensor, power source voltage from outside is received by the power source voltage input unit 331 and the GND voltage input unit 332. Then, the received power source voltage is supplied to each of the first and second C/V conversion circuits 321a and 321b, the first and second amplifier circuits 322a and 322b, the first and second ADCs 323a and 323b, the first and second diagnosis voltage outputting DACs 327a and 327b, the first and second carrier signal generating DACs 328a and 328b and the first and second substrate voltage generating DACs 329a and 329b which are the circuit elements shown in FIG. 1 through the first and second overcurrent switch circuits 101a and 101b provided for each of the detection units. The power source voltage received from outside is directly supplied to the reference voltage generation circuit 324, the oscillator and clock generation circuit 325, the memory 326 and the DSP circuit unit 330.

The reference voltage generated by the reference voltage generation circuit 324 is supplied to each of the first and second ADCs 323a and 323b, the first and second diagnosis voltage outputting DACs 327a and 327b, the first and second carrier signal generating DACs 328a and 328b and the first and second substrate voltage generating DACs 329a and 329b through the first and second overcurrent switch circuits 102a and 102b provided for each of the detection units. The reference voltage generation circuit 324 is shared among the respective detection units also in the present embodiment. Such a configuration makes it possible to achieve the size reduction of the signal detection LSI 320 and the reduction of manufacturing costs.

Also, the reference voltage generation circuit 324, the oscillator and clock generation circuit 325, the memory 326, the DSP circuit unit 330, the power source voltage input unit 331 and the GND voltage input unit 332 are shared among all of the detection units, and only one set thereof is provided in the present embodiment. The oscillator and clock generation circuit 325 inputs triggers for giving timings of carrier generation to each of the first and second carrier signal generating DACs 328a and 328b through the first and second overcurrent switch circuits 103a and 103b provided for each of the detection units.

Upon receiving the reference voltage, the first carrier signal generating DAC 328a and the second carrier signal generating DAC 328b receive clock triggers from the common oscillator and clock generation circuit 325 and apply carrier signals to the first carrier voltage application part 315a and the second carrier voltage application part 315b, respectively. At this time, the oscillator and clock generation circuit 325 is shared by the first and second acceleration detection elements 311a and 311b. However, different carrier signal generating DACs 328a and 328b are used for the first acceleration detection element 311a and the second acceleration detection element 311b, respectively.

Note that, since the carrier signals of the respective acceleration detection elements 311a and 311b are independent from each other, it is not always necessary that frequencies, amplitudes and phases of the carrier signals are identical, and it is also possible that the frequencies, amplitudes and phases are completely identical even when different carrier signal generating DACs are used.

In the first and second acceleration detection elements 311a and 311b, when an acceleration is applied, the movable parts are displaced to change relative distances with respect to the fixed parts. For instance, when an acceleration is applied in a direction of sensitivity of the first acceleration detection element 311a, the electrostatic capacitance of the first detection electrode 313a changes. The amount of change of the electrostatic capacitance of the first detection electrode 313a to which the carrier signal is applied is input to the first C/V conversion circuit 321a in the form of current and is converted into a voltage signal. The acceleration applied in the direction of sensitivity of the first acceleration detection element 311a converted into a voltage signal is output to an upper system through communication means such as SPI communication after passing through the first amplifier circuit 322a and the first ADC 323a and being subjected to waveform shaping by the DSP circuit unit 330, for example, noise reduction by a LPF and trimming adjustment of zero points or gains. At this time, the DSP circuit unit 330 and the memory 326 are shared by the acceleration detection elements 311a and 311b for the same reason as that of the reference voltage generation circuit 324. Since functions of the second acceleration detection element 311b are identical to those of the first acceleration detection element 311a, descriptions thereof will be omitted.

<Functions of Overcurrent Switch Circuit>

Figure 2:
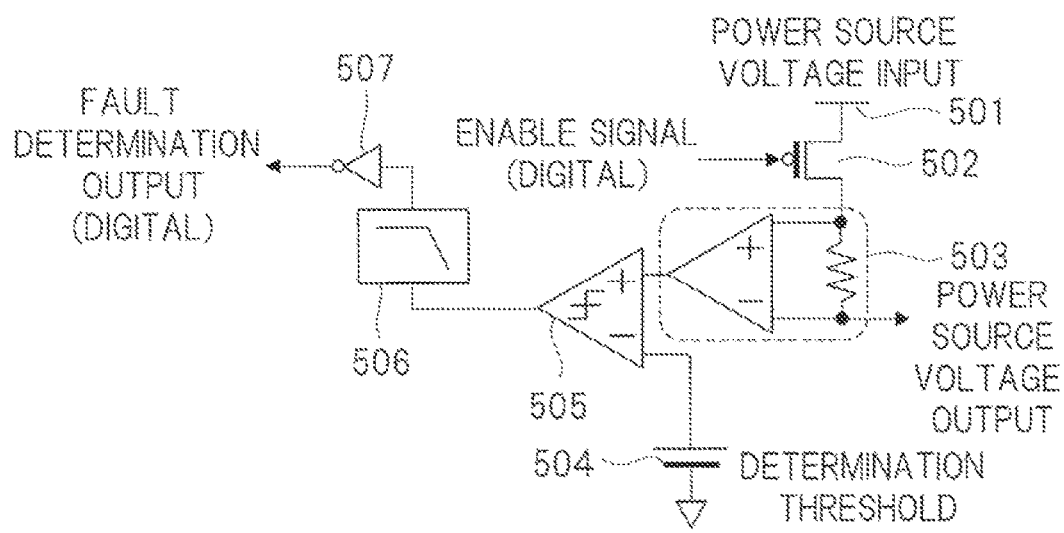
FIG. 2 is a diagram showing one example of a configuration of an overcurrent switch circuit for realizing detection of overcurrent and stop of a power source in the compound sensor shown in FIG. 1.
Figure 3:
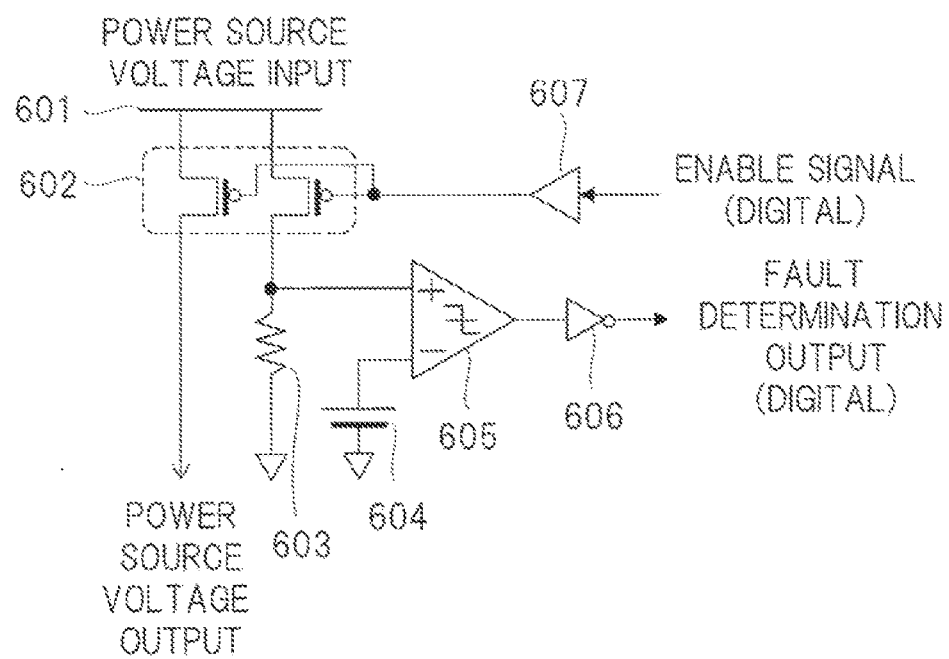
FIG. 3 is a diagram showing another example of a configuration of an overcurrent switch circuit for realizing detection of overcurrent and stop of a power source in the compound sensor shown in FIG. 1.
Figure 4A:
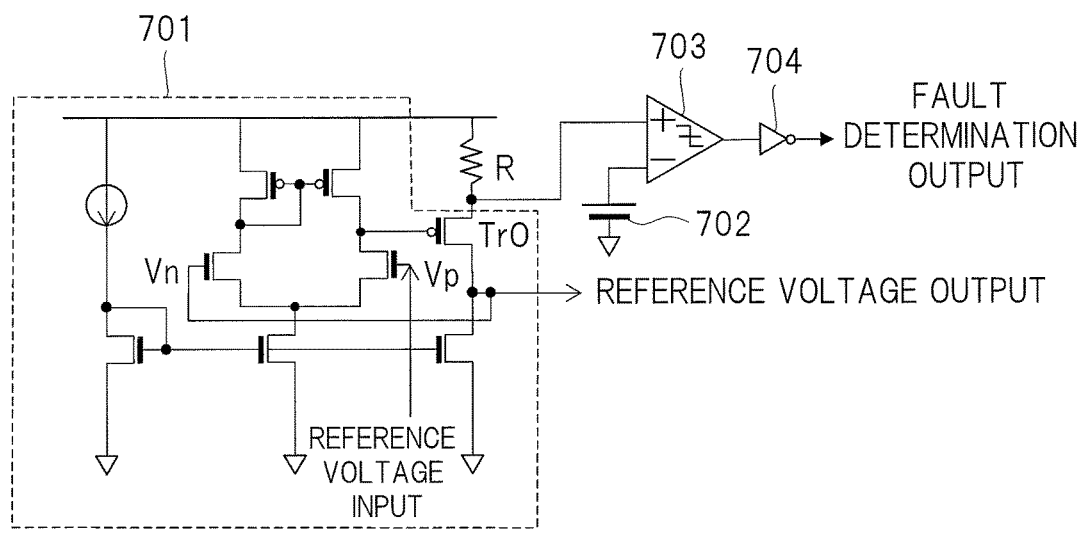
FIG. 4A and FIG. 4B are diagrams showing one example of a configuration of an overcurrent switch circuit for realizing separation of an influence of overcurrent and stop of a power source with respect to a reference voltage in the compound sensor shown in FIG. 1.
Figure 4B:
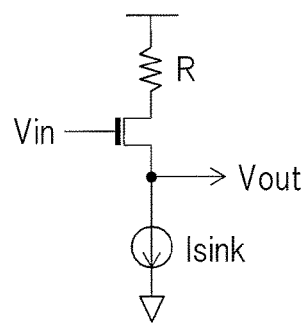

Functions of the above-described first and second overcurrent switch circuits (101a, 101b, 102a, 102b, 103a and 103b) will be described with reference to FIG. 2 to FIG. 4. FIG. 2 and FIG. 3 are diagrams showing configuration examples of an overcurrent switch circuit for realizing the detection of overcurrent and the stop of the power source. FIG. 4(a) and FIG. 4(b) are diagrams showing one example of an overcurrent switch circuit for realizing the separation of influence of overcurrent and the stop of the power source with respect to a reference voltage.

The overcurrent switch circuit shown in FIG. 2 is applicable to both of a power source voltage input from outside of the signal detection LSI 320 and the reference voltage generation circuit 324. Namely, it is applicable to the first and second overcurrent switch circuits 101a and 101b and the first and second overcurrent switch circuits 102a and 102b. Hereinafter in the descriptions of the overcurrent switch circuit, functions of the overcurrent switch circuits 101a and 101b for detecting the overcurrent of the power source voltage will be described, but when applied to the overcurrent switch circuits 102a and 102b, "power source voltage" is directly replaceable with "reference voltage". In this respect, it goes without saying that it is similarly applicable to the overcurrent switch circuits 103a and 103b of the oscillator and clock generation circuit 325.

The overcurrent switch circuits 101a and 101b shown in FIG. 2 is constituted of, for example, a voltage input unit 501, a switch 502 made up of a MOS transistor, a current detection circuit unit 503 made up of a resistor and an operational amplifier, a comparator 505 having a determination threshold 504, a LPF 506 and a fault determination output unit 507 made up of an inverter.

The power source voltage applied to the overcurrent switch circuits 101a and 101b is input to the current detection circuit unit 503 through the voltage input unit 501 and the switch 502, and an output thereof is output as a power source voltage to be supplied to detection units. At this time, the output of the current detection circuit unit 503 is compared with the determination threshold 504 in the comparator 505, passes through the LPF 506 for removing clock noise caused by digital circuits and current components generated in high frequencies, and is then sent from the fault determination output unit 507 to the external DSP circuit unit 330. However, the comparator 505 may have not only a configuration to detect that a value is larger than a predetermined value but also a configuration to detect that a value is smaller than a predetermined value or is within a predetermined range. Also, the LPF 506 may be mounted in the DSP circuit unit 330. This is because there is a possibility that a fault due to short circuit causes a fault mode in which a voltage disappears even though a voltage should be present. Further, the DSP circuit unit 330 switches an enable signal to a disable signal in order to turn the switch 502 off, namely, change the conducted state to an insulated state for the detection circuit of a detection element which is notified that the fault determination is true.

In this manner, by the function obtained by the combination of an analog circuit and a digital circuit (DSP circuit unit), the power source voltage of a detection element in which current having a magnitude different from a usual case flows due to a short circuit fault is isolated from other detection units. Accordingly, defects caused by abnormal current due to short circuit of a faulty detection element do not spread to the power source voltage, the reference voltage generation circuit 324, the oscillator and clock generation circuit 325, the memory 326 and the DSP circuit unit 330 shared by respective detection units. Such defects include the reduction in power source voltage and others as described above. Since the defects of a faulty detection element do not spread to other detection units having no fault, it is possible to continue outputs from detection units having no fault even after the occurrence of the fault.

Note that, in the overcurrent switch circuits 101a and 101b, the switch 502 and the output of the comparator 505 may be connected without interposing the DSP circuit unit 330. For instance, occurrence of defects is stored by fuses or the like based on outputs of the comparator 505 and the outputs thereof are supplied to the switch 502. Alternatively, it is also possible to employ a configuration in which inputs to the switch 502 are input also to the DSP circuit unit 330 in parallel to put a fault notification into an output frame of the sensor or a configuration in which inputs are directly output to an external output terminal (not shown) and a fault notification port is provided.

In another configuration example, the overcurrent switch circuit may have the configuration as shown in FIG. 3. The overcurrent switch circuits 101a and 101b shown in FIG. 3 are constituted of, for example, a voltage input unit 601, a switch 602 made up of two MOS transistors, a current detection circuit unit 603 made up of a resistor, a comparator 605 having a determination threshold 604, a fault determination output unit 606 made up of an inverter and a driver circuit 607.

The power source voltage applied to the overcurrent switch circuits 101a and 101b is input to the current detection circuit unit 603 after passing through the voltage input unit 601 and further the switch 602, and an output thereof is output as a power source voltage to be supplied to detection units. Here, the switch 602 is transistors which form a shunt MOS, and it is configured to make a current amount flowing on the power source side flow to the current detection circuit unit 603 based on a MOS size or a ratio of parallel number. By using the shunt MOS, it is possible to obtain the effect of maintaining the voltage of the power source voltage output to be a constant value independent from the amount of consumption current and the effect of suppressing the influence of the consumption current or the like of the current detection circuit unit 603 from being given to the power source voltage output side. The current amount converted into voltage in the current detection circuit unit 603 is compared with the determination threshold 604 in the comparator 605 and is then sent from the fault determination output unit 606 to the external DSP circuit unit 330. The DSP circuit unit 330 switches an enable signal to a disable signal in order to turn the switch 602 off for the detection unit which is notified that the fault determination is true. The disable signal turns the switch 602 off via the driver circuit 607. It goes without saying that there are large variations for the configuration of the comparator, the difference of analog and digital and detailed configurations of the circuits such as an insertion position of the LPF like the overcurrent switch circuit shown in FIG. 2.

Although the two overcurrent switch circuits shown as the configuration examples described above are applicable to both of power source voltage and reference voltage, an overcurrent switch circuit may be configured to have a configuration using a buffer circuit as shown in FIG. 4(a) and FIG. 4(b) described below for only the reference voltage which is generally set to be lower than the power source voltage. For instance, the buffer circuit can be realized by configuring a voltage follower using operational amplifiers or by configuring a source follower circuit using transistors, and since it has an impedance conversion effect in addition to being able to reduce an output impedance and realize more favorable properties as a reference voltage, it is possible to obtain the effect of suppressing the fluctuations in the reference voltage even in the case of the occurrence of large current due to short circuit in a detection element or the like.

The overcurrent switch circuits 102a and 102b shown in FIG. 4 (a) are constituted of, for example, an operational amplifier 701 made up of eight MOS transistors and a current source, a comparator 703 having a determination threshold 702, a fault determination output unit 704 made up of an inverter and a resistor R. FIG. 4 shows a circuit configuration in which a voltage follower is configured by connecting a Vn input and an output terminal of the operational amplifier 701 made up of the MOS transistors, a reference voltage is supplied to a Vp input, and the same voltage as the input reference voltage is obtained at the output terminal. Here, the resistor R is inserted to an output stage of the operational amplifier 701. This provides an effect of generating the voltage drop by the resistor R when a short circuit occurs in a circuit network connected to the reference voltage output unit. Since the voltage drop reduces the source-drain voltage Vds of a transistor TrO and no drain current can be made to flow, the current amount output from the reference voltage output unit is consequently limited by the resistor R. In other words, this configuration makes up a circuit serving as an insulation switch of the detection unit associated with the detection of overcurrent.

However, when an excessively large current is generated by short circuit, a problem of increase in the amount of consumption current in the entire sensor arises. The increase in the amount of consumption current causes defects in the system such as a shortage in the capacitance of a backup capacitor for coping with instantaneous power interruption and a problem of heat generation even though abnormalities in sensor outputs are not observed immediately. Further, when the current amount exceeds a value which can flow through the buffer circuit, current excessively flows from the buffer circuit, with the result that a problem of drop in output voltage of the reference voltage generation circuit 324 or the like occurs in the same manner. Accordingly, even the configuration utilizing a buffer circuit desirably has the function of detecting the overcurrent, stopping the power source voltage of the corresponding detection unit and the power supply to the buffer circuit, and insulating the detection unit. For realizing this, fault notification to an upper system is carried out by comparing voltages at both ends of the resistor R with the determination threshold 702 in the comparator 703 and sending the result from the fault determination output unit 704 to the external DSP circuit unit 330. The upper system supplies a disable signal not only to a switch (not shown) for turning off the power source voltage of the buffer circuit but also to a switch (not shown) for turning off all of the power source voltages of the circuits of the corresponding detection units.

Also, the overcurrent switch circuit shown in FIG. 4(*b*) is made up of a transistor, a resistor R and a low current circuit with a current Isink, and it outputs Vin to Vout at a low impedance by a source follower circuit. On the other hand, when excessively large current flows from Vout, since the voltage drop at the resistor R reduces the source-drain voltage Vds of the transistor and no drain current can be made to flow, the current amount output from the reference voltage output unit is consequently limited by the resistor R. In other words, this configuration makes up a circuit serving as an insulation switch of the detection unit associated with the detection of overcurrent.

The configurations shown in FIG. 4 (*a*) and FIG. 4 (*b*) above make it possible to realize the circuit to perform the detection of overcurrent and the resulting isolation of the corresponding detection unit like the overcurrent switch circuit shown in FIG. 2 and FIG. 3.

Further, a configuration in which the resistor R is eliminated and the overcurrent is detected by detecting output current of the buffer circuit and current flowing to the power source voltage of the buffer circuit is of course conceivable. In this case, output current of the buffer circuit and current flowing to the power source voltage of the buffer circuit are detected, and detection of overcurrent is notified to the DSP circuit unit through the current detection circuit shown in FIG. 2, namely, through the current detection circuit unit, the determination threshold, the comparator and the fault determination output unit. Then, it is also possible to configure the overcurrent switch circuit by supplying a disable signal output from the DSP circuit unit to the power source circuit of the buffer circuit or the switch provided in the output circuit of the buffer circuit.

Note that the configuration using the buffer circuit for the power source voltage is not always advantageous because it is difficult to set the output voltage of the buffer circuit to be the same level as that of the power source voltage (to secure swings) and it is necessary to take large drivability of the buffer circuit. However, since this configuration is not unrealizable if the so-called rail-to-rail operational amplifiers are used, it is also possible to employ the configuration using buffer circuit also for the power source voltage.

When the reference voltage is set to be lower than the power source voltage, the circuit for detecting the fluctuations in the reference voltage may have the configuration in which the overcurrent is indirectly detected based on the change in difference between the power source voltage and the reference voltage. Since the effect of the present embodiment is not the detection of overcurrent but is the insulation of the power source circuit upon detection of the fault, the method of detecting the fault is not limited to the method of directly measuring the overcurrent, and may be the method of measuring the voltage as described above.

In the overcurrent switch circuit described so far, switches may be added further at any positions for the purpose of insulation, and the transistors may also be mounted by a method other than that for MOS-FET transistors.

The circuits shown in FIG. 2, FIG. 3 and FIG. 4 are minimum circuits required for describing the functions of the present invention, and FIG. 2, FIG. 3 and FIG. 4 are merely abstractive circuit diagrams for describing the functions. Since the present invention relates to a configuration of a sensor, the circuit configurations of FIG. 2, FIG. 3 and FIG. 4 are only examples in terms of mounting in actually utilizing the present invention. The mounting method of the circuits is not a concept which expands the configuration of the sensor disclosed in the present embodiment.

<Change in Sensor Output at the Time of Fault Occurrence>

The change in sensor output at the time of fault occurrence will be described with reference to FIG. 5. FIG. 5 is a diagram showing one example of the change in sensor output at the time of fault occurrence on a time axis. The change in sensor output at the time of fault occurrence relates to a relationship of responsiveness of the overcurrent switch circuit and LPF output of the sensor.

FIG. 5 is a time-series graph in which the acceleration output of the first acceleration detection element 311*a* is given as Y_G, the acceleration output of the second acceleration detection element 311*b* is given as X_G and the consumption current of the first acceleration detection element 311*a* is given as I_Y. At the time point of fault occurrence, a short circuit has occurred in the first acceleration detection element 311*a*, and offsets are caused in the acceleration output Y_G of the first acceleration detection element 311*a* and the acceleration output X_G of the second acceleration detection element 311*b* due to the voltage drop of the reference voltage generation circuit 324. Here, the overcurrent switch circuit performs fault determination based on the increase in the consumption current I_Y of the first acceleration detection element 311*a* and stops the power supply to the first acceleration detection element 311*a*. As a result, the acceleration output X_G of the second acceleration detection element 311*b* returns to the normal value, but the fluctuation in output can be observed also in the acceleration output X_G of the second acceleration detection element 311*b* having no fault during a period from the fault occurrence of the first acceleration detection element 311*a* to the completion of recovery. This is a matter of a principle that a delay time T_d from the occurrence of short circuit in the first acceleration detection element 311*a* and its detection to the stop of the power supply cannot be completely eliminated. In other words, it is impossible to avoid the spread of the fault to the output of the second acceleration detection element 311*b* having no fault during the time T_d from the fault occurrence in principle.

However, a sensor is generally configured to have a LPF at the last stage (incorporated in the DSP circuit unit 330 in the present embodiment) and noise components except a desired bandwidth are eliminated. Therefore, if the delay time T_d from occurrence of overcurrent and detection thereof by the overcurrent switch circuit to recovery after insulating the faulty detection unit is shorter than a delay time T_LPF determined by the bandwidth of the LPF at the last stage of the sensor, it is possible to limit the influence thereof to be small after passing through the LPF at the last stage like that indicated by the dotted line in the acceleration output X_G of the second acceleration detection element 311b in FIG. 5. Namely, by configuring the overcurrent switch circuit so as to satisfy the relation of T_d<T_LPF, independence of respective detection elements can be secured in design within a range sufficient for the actual use.

Further, it is apparently desirable to make T_d shorter if possible. Thus, by providing charging capacitors at respective output units in order to suppress the drops in the reference voltage and the power source voltage at the time of occurrence of overcurrent due to short circuit, the time until the occurrence of voltage drop from the occurrence of overcurrent is extended, and the effect of substantially shortening the delay time T_d can be obtained.

Note that, in the configuration example of the present embodiment, the diagnosis voltage outputting DACs 327a and 327b are provided for each of the detection elements. The first acceleration detection element 311a includes the first diagnosis voltage outputting DAC 327a and the second acceleration detection element 311b includes the second diagnosis voltage outputting DAC 327b. The reason why the diagnosis voltage outputting DACs 327a and 327b are separately provided is that the application of diagnosis voltage and the diagnosis of fault based on the detection of displacement can be performed by the acceleration detection element having no short circuit even when a short circuit has occurred in the diagnosis electrode.

For instance, in the case where a fault diagnosis outputting DAC is shared by the first acceleration detection element and the second acceleration detection element like in the prior art, though it depends on the relationship of impedance of the respective electrodes in which the short circuit has occurred, the voltage output value of the fault diagnosis outputting DAC will not be the designed voltage when a fault due to short circuit has occurred in the diagnosis electrodes of, for instance, the first acceleration detection element. Accordingly, in order to reliably suppress the spread of fault of an acceleration detection element to other acceleration detection units having no fault, it is necessary to employ a configuration in which an independent diagnosis voltage outputting DAC is provided for each of the detection elements by the circuit to perform the detection of overcurrent and the insulation of the corresponding detection unit like in the present embodiment even though the circuit becomes redundant.

The substrate voltage generating DACs 329a and 329b are also provided as independent circuits by the circuit to perform the detection of overcurrent and the insulation of the corresponding detection unit for the first acceleration detection element 311a and the second acceleration detection element 311b. With such a configuration, the substrate voltage generating DACs 329a and 329b are separately provided so that substrate voltage can be applied in the acceleration detection element having no short circuit even when short circuit has occurred in a circuit related to the substrate voltage generating DAC. As mentioned in the paragraph of the prior art, the substrate voltage indicates the voltage of the dummy pattern parts 316a and 316b, and it is generally desirable to provide a function of fixing the voltage to a constant value instead of leaving it in a floating state.

The carrier signal generating DACs 328a and 328b are also provided as independent circuits by the circuit to perform the detection of overcurrent and the insulation of the corresponding detection unit for the first acceleration detection element 311a and the second acceleration detection element 311b. With such a configuration, the carrier signal generating DACs 328a and 328b are separately provided so that carrier voltage can be applied in the acceleration detection element having no short circuit even when short circuit has occurred in a circuit related to the carrier signal generating DAC.

Also, the first acceleration detection element 311a and the second acceleration detection element 311b may be fabricated on the same chip as the acceleration detection element chip 311 as shown in FIG. 1 or fabricated on different chips. In the case where they are respectively fabricated on different chips, since substrate voltages can be independently set, even when a short circuit fault related to the substrate voltage has occurred, the fault does not spread to other acceleration detection units. In the case where a plurality of acceleration detection elements are fabricated on the same chip, it is desirable to employ a configuration in which substrate voltages are independently set like the case where the acceleration detection elements are fabricated on separate chips (FIG. 1). For instance, by forming deep grooves in a silicon substrate by etching such as DRIE and forming an oxide film in the deep grooves, respective conductive parts separated by the deep grooves are insulated by the oxide film and the voltage separation on the same silicon substrate can be achieved.

Further, in the present embodiment, it is conceivable to employ the configuration in which some difference is intentionally given to the voltages of the detection electrodes 313a and 313b, the diagnosis electrodes 314a and 314b and the movable parts 312a and 312b and to the DC voltages of the substrate voltages of the dummy pattern parts 316a and 316b. This is because, since no current flows even when conductive bodies having the same voltage come into contact, fault detection based on current cannot be performed even if the contact is a fault mode. Accordingly, it is conceivable to employ the configuration in which voltages including the substrate voltage are supplied so as to have differences at DC levels in all conductive bodies. At this time, if the voltage difference is large, since influences of parasitic components and electrostatic force become large as described above, it is desirable that the DC voltage difference between electrodes and conductive bodies is small. The voltage difference is not limited to DC components but may also be AC components, and if frequencies thereof are sufficiently higher than response frequencies of the movable parts of the acceleration detection elements 311a and 311b, the electrostatic force generated between the conductive bodies by voltage does not cause the displacement of the movable parts. On the side of the overcurrent switch circuit, current can be detected at high SNR by performing synchronous detection at the same frequencies as those of the AC components of the voltage difference.

<Sensor Output Format in Normal State and at Fault Occurrence>

Sensor output formats in a normal state and at the time of fault occurrence will be described with reference to FIG. 6. FIG. 6 is a diagram showing examples of sensor output formats, and FIG. 6(a) shows a format in a normal state and FIG. 6(b) shows a format at the time of fault occurrence.

When the compound sensor of the present embodiment notifies a detected acceleration to an upper system by communication means such as the SPI communication incorporated in the DSP circuit unit 330, a diagnosis flag (DIAG) indicating an operating state of the overcurrent switch circuit is output together with an acceleration output (YG) of the first acceleration detection element 311a and an acceleration output (XG) of the second acceleration detection element 311b as shown in FIG. 6(a). In this manner, since the upper system can confirm the acceleration detection element in which a fault has occurred, it is possible to determine to continue the system functions using the acceleration detection element having no fault. Also, by further detecting the fact that the consumption current at the corresponding part has escaped from the overcurrent by the stop of power supply after the occurrence of fault, a flag showing the completion of fault handling indicating that the fault part is insulated properly may be output.

At the time of fault occurrence, an output value of the acceleration detection element in which the fault has occurred (acceleration output of the first acceleration detection element denoted with "YG" in FIG. 6 (b)) may be set to a value outside a normal output range in addition to attaching a diagnosis flag like in FIG. 6(b). In the case of 16 bit output, +32767 and −32768 are examples thereof.

In the example of FIG. 6(b), the diagnosis flag (DIAG) is changed to "0x0202" from "0x0000" in a normal state, and it can be determined from "2" of the first digit that a fault has occurred in the first acceleration detection element 311a and it can be determined from "2" of the third digit that the first acceleration detection element 311a is reliably insulated. Further, the acceleration output (YG) of the first acceleration detection element 311a is changed to "0x8000" from "0xFE00" in a normal state, and the occurrence of fault can be determined from the value outside the normal range. Note that, since the acceleration output (XG) of the second acceleration detection element 311b remains "0x0200" equal to that in a normal state, it can be determined that no fault has occurred.

By providing the function like this, it is possible to reduce the possibility of erroneously using the acceleration or angular velocity output at the time of fault occurrence in an upper system.

As described above, in a compound sensor according to the present embodiment, by collectively putting the outputs of all detection elements detected by the compound sensor and the diagnosis flags indicating presence or absence of overcurrent detection and results of handling into a series of communication frames, an upper system can advantageously reduce the number of communications compared to the case of using a plurality of individual sensors. Moreover, when being connected to a network to which a large number of nodes are connected such as CAN (Controller Area Network), it is possible to suppress the congestion of communication.

<Mounting Method of Signal Detection LSI>

Figure 7:
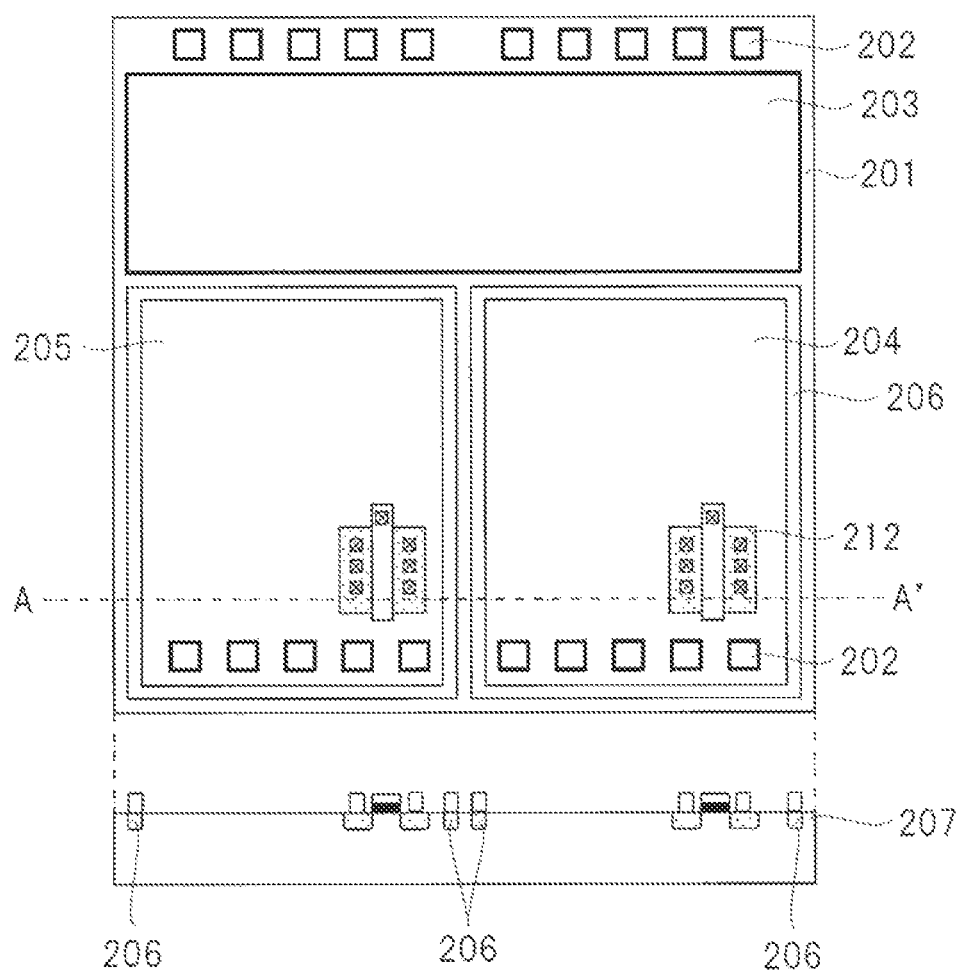
FIG. 7 is a diagram showing one example of a mounting method of a signal detection LSI in the compound sensor shown in FIG. 1.
Figure 8:
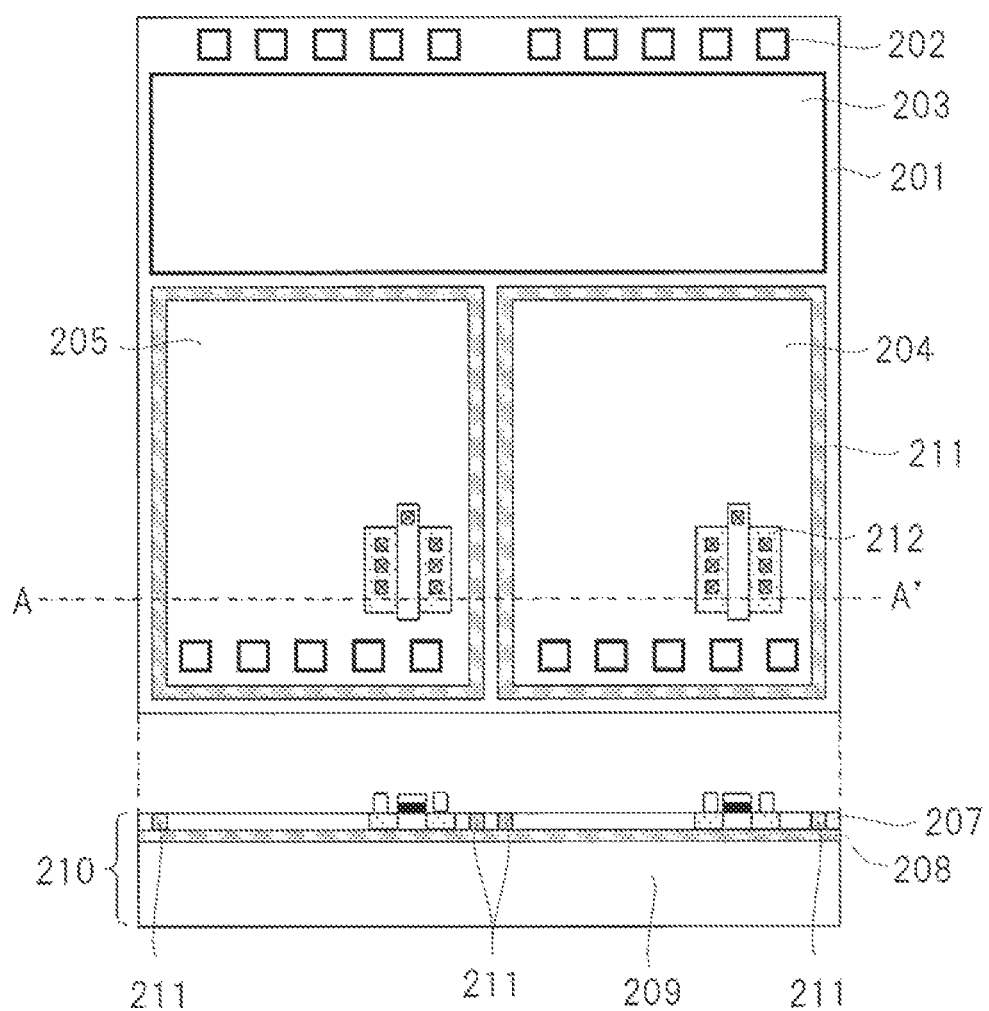
FIG. 8 is a diagram showing another example of a mounting method of a signal detection LSI in the compound sensor shown in FIG. 1.

Amounting method of a signal detection LSI will be described with reference to FIG. 7 and FIG. 8. FIG. 7 and FIG. 8 are diagrams respectively showing an example of a mounting method of a signal detection LSI. This signal detection LSI corresponds to the signal detection LSI 320 shown in FIG. 1.

In the mounting method of the signal detection LSI shown in FIG. 7, sizes of the respective parts are largely different from actual ones for the sake of describing the functions thereof. Also, in FIG. 7, the upper part of the drawing is a plan view and the lower part of the drawing is a sectional view taken along the cutting line A-A' of the plan view in the upper part.

In the mounting method of the signal detection LSI shown in FIG. 7, a plurality of pads 202 for making electrical contact with the outside, a circuit mounting part 203 common to the first and second acceleration detection elements 311a and 311b, a first signal processing circuit part 204 for the first acceleration detection element 311a and a second signal processing circuit part 205 for the second acceleration detection element 311b are formed on the signal detection LSI 201. Further, guard rings 206 formed so as to surround the first signal processing circuit part 204 and the second signal processing circuit part 205 are formed on the signal detection LSI 201. The respective pads 202, the circuit mounting part 203, the signal processing circuit parts 204 and 205 and the guard rings 206 are formed on a substrate part 207. In the first and second signal processing circuit parts 204 and 205, a plurality of MOS transistors 212 are formed.

Here, the guard ring 206 is a diffusion layer of the same conductivity type as that of the substrate part 207 and has a higher concentration than that of the substrate part 207. For instance, when the substrate part is an n type substrate, the guard ring is $n^+$ type.

The guard rings 206 are provided for preventing, for example, the fluctuation of the voltage of the substrate part 207 of the second signal processing circuit unit 205 when a short circuit of the substrate part 207 and circuit elements has occurred in the first signal processing circuit unit 204. Specifically, when the substrate part 207 is at the ground level, the guard ring 206 is also made to be at the ground level, whereby even when short circuit occurs between the first signal processing circuit part 204 and the substrate part 207 and the voltage level of the substrate part 207 fluctuates due to the impedance components in the substrate ($n^-$), since the voltage level of the low impedance ($n^+$) is present around the first signal processing circuit part 204, the current flows to the guard ring of the first signal processing circuit part 204. Therefore, it is possible to achieve the effect that the second signal processing circuit part 205 is hardly affected by the short circuit which has occurred between the first signal processing circuit part 204 and the substrate part 207. Since this effect is not limited to the short circuit defect on the side of the signal processing circuit part, but is also true for the fluctuation of the substrate voltage of the signal processing circuit part due to the short circuit of a detection element on the load side or the like, employing this mounting method in the embodiment of the present invention leads to further enhancement of the effect of the present invention. Although the case in which two detection elements are provided has been described here, when more detection elements are provided, a configuration in which electrical separation is made for each of the detection elements is employed. Also, the detection elements may detect different physical quantities, for instance, acceleration and angular velocity.

Also in another mounting method of the signal detection LSI shown in FIG. 8, sizes of the respective parts are largely different from actual ones for the sake of describing the functions thereof. Also, in FIG. 8, the upper part of the drawing is a plan view and the lower part of the drawing is a sectional view taken along the cutting line A-A' of the plan view in the upper part.

This mounting method of the signal detection LSI shown in FIG. 8 shows an example of the fabrication on a SOI (Silicon On Insulator) substrate 210. The SOI substrate 210 has a structure in which an insulation layer 208 is interposed between a substrate part 207 and a substrate part 209. Insulation layers 211 are formed in a depth direction of the SOI substrate 210 so as to surround the signal processing circuit parts 204 and 205. Since the substrate part 207 is electrically separated between the first signal processing circuit part 204 and the second signal processing circuit part 205 by the insulation layer 208 of the SOI substrate 210 and the fabricated insulation layers 211, it is possible to suppress the fluctuation in voltage of the substrate part 207 on the side of the detection element in which a fault such as short circuit has occurred from spreading to the substrate part 207 of the detection element in which no fault has occurred as described above. Although the case in which two detection elements are provided has been described here, when more detection elements are provided, a configuration in which electrical separation is made for each of the detection elements is employed. Also, the detection elements may detect different physical quantities, for instance, acceleration and angular velocity.

These mounting methods of the signal detection LSI play an auxiliary role of the circuit to perform the detection of overcurrent and the insulation of the corresponding detection element disclosed in the present invention, and these methods alone do not solve the problem addressed by the present invention. However, it is possible to more reliably realize electric insulation of each of the detection units by combining the circuit to perform the detection of overcurrent and the insulation of the corresponding detection unit disclosed in the present invention with the above-described mounting methods of the signal detection LSI. Accordingly, it is desirable to mount the signal detection LSI by the mounting methods of the signal detection LSI in embodying the present invention.

Effect of First Embodiment

According to the present embodiment described above, the following effects can be achieved in a compound sensor realizing the biaxial acceleration detection. Namely, by providing overcurrent switch circuits 101a, 101b, 102a, 102b, 103a and 103b for respective detection units so that the circuit to perform the detection of overcurrent and the insulation of the corresponding detection unit is formed to have the configuration to stop the power supply to a faulty detection unit when an electric fault such as a short circuit has occurred, it is possible to prevent spread of the fault to other detection units caused by mechanical faults. Further, in view of the fact that the fault occurrence rate of a solid state signal detection LSI 320 is sufficiently low when compared to the fault occurrence rate of the acceleration detection element chip 311 with a mechanical structure, it is possible to reduce the probability of simultaneous fault occurrence of detection units of the compound sensor.

Further, besides the overcurrent, a configuration in which an abnormality of a detection unit is electrically detected and power supply to the corresponding detection unit is stopped also falls into the scope of the present invention. The faults of a detection unit include a fault by which a circuit becomes open, and such a configuration can be realized by detecting the change in charge amount generated between electrodes caused by the open fault of the circuit in the form of current through the C/V conversion circuit.

More specifically, the following effects can be obtained.

(1) By providing a plurality of detection units made up of the C/V conversion circuits 321a and 321b, the amplifier circuits 322a and 322b, the ADCs 323a and 323b, the diagnosis voltage outputting DACs 327a and 327b, the carrier signal generating DACs 328a and 328b and the substrate voltage generating DACs 329a and 329b which are signal detection circuits provided for each of a plurality of detection elements, the power source voltage input unit 331 and the GND voltage input unit 332 shared among each of the plurality of detection units, and the overcurrent switch circuits 101a and 101b which are fault detection circuits provided for each of the plurality of detection units for detecting faults of the detection elements and stopping power supply to the faulty detection unit, it is possible to suppress a fault which has occurred in a certain detection element from affecting other detection units in which no fault has occurred. Accordingly, a compound sensor robust against faults in which a fault of a certain detection element does not spread to other detection units can be configured.

(2) The overcurrent switch circuits 101a and 101b detect the fault occurrence when a current is not at a predetermined value or when a current is larger than a threshold, that is, overcurrent, so that the circuit to perform the detection of overcurrent and the accompanying insulation of the corresponding detection unit can be realized.

(3) It is possible to realize biaxial acceleration detection by providing the first and second acceleration detection elements 311a and 311b as a plurality of detection elements.

(4) By further providing the reference voltage generation circuit 324 and the oscillator and clock generation circuit 325 shared among each of the plurality of detection units and providing buffer circuits for the overcurrent switch circuits 102a, 102b, 103a and 103b, at least one of the voltage signal of reference voltage generated by the reference voltage generating circuit 324 and the clock voltage signal generated by the oscillator and clock generation circuit 325 can be supplied to respective detection units through each of the buffer circuits. Then, the overcurrent switch circuits 102a, 102b, 103a and 103b can monitor the change in consumption current of the buffer circuits, determine the fault of detection elements when the current is not at a predetermined current value, and stop the power supply to the faulty detection unit.

(5) By providing a LPF for the DSP circuit unit 330 and setting the response time (T_d) from the detection of a fault of each detection element to the stop of power supply to the faulty detection element to be shorter than a time constant of the LPF (T_LPF) in the overcurrent switch circuits 101a, 101b, 102a, 102b, 103a and 103b, independence of respective detection elements can be secured in design within a range sufficient for the actual use.

(6) By providing a communication circuit such as SPI communication in the DSP circuit unit 330, it is possible to notify an upper system by an output communication frame that the overcurrent switch circuits 101a, 101b, 102a, 102b, 103a and 103b have stopped the power supply to the faulty detection unit. Further, the output communication frame can contain the contents to notify that the power supply to the faulty detection unit has been stopped and the output values of the plurality of detection elements.

(7) In each of the detection elements including the movable parts 312a and 312b, the detection electrodes 313a and 313b, the diagnosis electrodes 314a and 314b, the dummy pattern parts 316a and 316b and others, by intentionally setting the voltages of the dummy pattern parts 316a and 316b to be different from any one of the voltages of the movable parts 312a and 312b, the detection electrodes 313a and 313b and the diagnosis electrodes 314a and 314b, it is possible to detect a fault in the case of a fault mode due to contact or the like.

Second Embodiment

The compound sensor according to the second embodiment will be described with reference to FIG. 9 and FIG. 10. In the second embodiment, descriptions of the parts identical to those of the above-described first embodiment are omitted, and different parts will be mainly described.

<Configuration and Operation of Compound Sensor>

The configuration of the compound sensor according to the present embodiment will be described with reference to FIG. 9. FIG. 9 is a diagram showing one example of an overall configuration of the compound sensor. In the present embodiment, a configuration example of a compound sensor including biaxial acceleration detection elements and a uniaxial angular velocity detection element will be described. Namely, this is a configuration example in which a uniaxial angular velocity detection element is added to the first embodiment described above.

Figure 9:
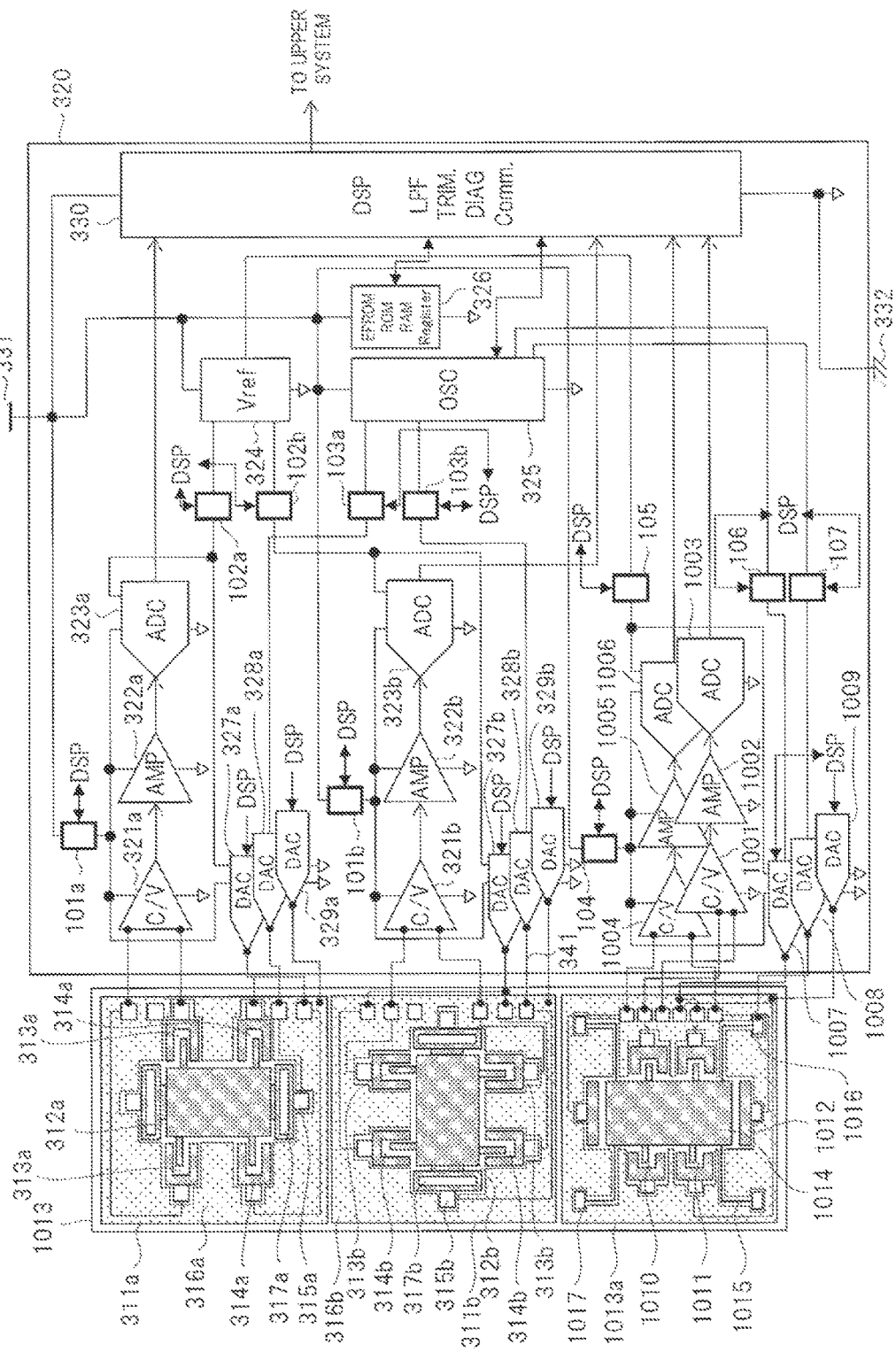
FIG. 9 is a diagram showing one example of an overall configuration of a compound sensor according to the second embodiment of the present invention.

The compound sensor of FIG. 9 is configured to include an acceleration/angular velocity detection element chip 1013 and a signal detection LSI 320. The acceleration/angular velocity detection element chip 1013 includes a first acceleration detection element 311a, a second acceleration detection element 311b and a first angular velocity detection element 1013a.

The first acceleration detection element 311a of the acceleration/angular velocity detection element chip 1013 includes a first movable part 312a which is displaced by an acceleration and first detection electrodes 313a which form a capacitor together with a fixed part which is not displaced with respect to the movable part 312a and detect an acceleration, and the second acceleration detection element 311b thereof includes a second movable part 312b which is displaced by an acceleration and second detection electrodes 313b which form a capacitor together with a fixed part which is not displaced with respect to the movable part 312b and detect an acceleration. Further, the first acceleration detection element 311a includes the movable part 312a and first diagnosis electrodes 314a which form a capacitor together with the fixed part which is not displaced with respect to the movable part 312a and realize a function of applying a voltage to forcibly displace the movable part 312a by an electrostatic force, and the second acceleration detection element 311b includes the movable part 312b and second diagnosis electrodes 314b which form a capacitor together with the fixed part which is not displaced with respect to the movable part 312b and realize a function of applying a voltage to forcibly displace the movable part 312b by an electrostatic force. Moreover, first and second carrier voltage application parts 315a and 315b for supplying carrier voltage to the respective detection electrodes 313a and 313b are provided in the first and second acceleration detection elements 311a and 311b, respectively. In addition, first and second support beams 317a and 317b for supporting the movable parts 312a and 312b and first and second dummy pattern parts 316a and 316b which are regions other than the movable parts and the fixed parts are provided in the first and second acceleration detection elements 311a and 311b, respectively.

Also, the first angular velocity detection element 1013a of the acceleration/angular velocity detection element chip 1013 includes a movable part 1014 which is displaced by an angular velocity and a driving electrostatic force and driving electrodes 1010 which form a capacitor together with a fixed part which is not displaced with respect to the movable part 1014 and generate an electrostatic force for vibrating the movable part 1014 at a constant amplitude and frequency. Further, the first angular velocity detection element 1013a includes monitor electrodes 1011 which form a capacitor together with a fixed part which is not displaced with respect to the movable part 1014 and detect the displacement of the movable part 1014. Moreover, the first angular velocity detection element 1013a includes detection electrodes 1012 which form a capacitor together with a fixed part which is not displaced with respect to the movable part 1014 and detect the displacement of the movable part 1014 which has received Coriolis force in a direction orthogonal to the vibration direction caused as a result of applying an angular velocity to the vibrated movable part 1014. In addition, the first angular velocity detection element 1013a includes a carrier voltage application part 1016 for applying carrier voltages to the monitor electrode 1011 and the detection electrode 1012. Moreover, the first angular velocity detection element 1013a includes a support beam 1015 for supporting the movable part 1014 and a dummy pattern part 1017 which is a region other than the movable parts and the fixed parts.

The signal detection LSI 320 includes first and second C/V conversion circuits 321a and 321b, first and second amplifier circuits 322a and 322b, first and second ADCs 323a and 323b, first and second diagnosis voltage outputting DACs 327a and 327b, first and second carrier signal generating DACs 328a and 328b and first and second substrate voltage generating DACs 329a and 329b for each of the detection elements. A first acceleration detection unit is constituted of the above-described first acceleration detection element 311a and its detection circuits (the first C/V conversion circuit 321a, the first amplifier circuit 322a, the first ADC 323a, the first diagnosis voltage outputting DAC 327a, the first carrier signal generating DAC 328a and the first substrate voltage generating DAC 329a) and a second acceleration detection unit is constituted of the above-described second acceleration detection element 311b and its detection circuits (the second C/V conversion circuit 321b, the second amplifier circuit 322b, the second ADC 323b, the second diagnosis voltage outputting DAC 327b, the second carrier signal generating DAC 328b and the second substrate voltage generating DAC 329b). Also, the signal detection LSI 320 further includes a third C/V conversion circuit 1001, a third amplifier circuit 1002, a third ADC 1003, a fourth C/V conversion circuit 1004, a fourth amplifier circuit 1005, a fourth ADC 1006, a first driving voltage generating DAC 1007, a third carrier signal generating DAC 1008 and a third substrate voltage generating DAC 1009. A first angular velocity detection unit is constituted of the above-described first angular velocity detection element 1013a and its detection circuits (the third C/V conversion circuit 1001, the third amplifier circuit 1002, the third ADC 1003, the fourth C/V conversion circuit 1004, the fourth amplifier circuit 1005, the fourth ADC 1006, the first driving voltage generating DAC 1007, the third carrier signal generating DAC 1008 and the third substrate voltage generating DAC 1009). Further, the signal detection LSI 320 is provided with a reference voltage generation circuit 324, an oscillator and clock generation circuit 325, a memory 326 such as an EPROM, a ROM, a RAM or register, a DSP circuit unit 330, a power source voltage input unit 331 and a GND voltage input unit 332, and only one set thereof is provided.

The acceleration/angular velocity detection element chip 1013 of the first and second acceleration detection elements 311a and 311b and the first angular velocity detection element 1013a and the signal detection LSI 320 are electrically connected by bonding wires 341.

Operations of the compound sensor for acceleration and angular velocity configured as described above will be described. In the signal detection LSI 320 of the compound sensor, power source voltage from outside is received by the power source voltage input unit 331 and the GND voltage input unit 332. Then, the received power source voltage is supplied to each of the first to fourth C/V conversion circuits 321a, 321b 1010 and 1004, the first to fourth amplifier circuits 322a, 322b, 1002 and 1005, the first to fourth ADCs 323a, 323b, 1003 and 1006, the first and second diagnosis voltage outputting DACs 327a and 327b, the first to third carrier signal generating DACs 328a, 328b and 1008, the first to third substrate voltage generating DACs 329a, 329b and 1009 and the driving voltage generating DAC 1007 which are the circuit elements shown in FIG. 9 through the overcurrent switch circuits 101a, 101b and 104 provided for each of the detection units. The power source voltage received from outside is directly supplied to the reference voltage generation circuit 324, the oscillator and clock generation circuit 325, the memory 326 and the DSP circuit unit 330.

The reference voltage generated by the reference voltage generation circuit 324 is supplied to each of the first to fourth ADCs 323a, 323b, 1003 and 1006, the first and second diagnosis voltage outputting DACs 327a and 327b, the first to third carrier signal generating DACs 328a, 328b and 1008, the first to third substrate voltage generating DACs 329a, 329b and 1009 and the driving voltage generating DAC 1007 through the overcurrent switch circuits 102a, 102b and 105 provided for each of the detection units. Since the reference voltage generation circuit 324 is shared among the respective detection units even in the compound sensor of the present embodiment as described above, only one reference voltage generation circuit 324 is provided in the compound sensor. Such a configuration makes it possible to achieve the size reduction of the signal detection LSI 320 and the reduction of manufacturing costs.

Also, the reference voltage generation circuit 324, the oscillator and clock generation circuit 325, the memory 326, the DSP circuit unit 330, the power source voltage input unit 331 and the GND voltage input unit 332 are shared among all of the detection units, and only one set thereof is provided in the present embodiment. The oscillator and clock generation circuit 325 inputs triggers for giving timings of carrier generation to the first to third carrier signal generating DACs 328a, 328b and 1008 through the overcurrent switch circuits 103a, 103b and 107 provided for each of the detection units.

Upon receiving the reference voltage, the first carrier signal generating DAC 328a, the second carrier signal generating DAC 328b and the third carrier signal generating DAC 1008 receive clock triggers from the common oscillator and clock generation circuit 325 and apply carrier signals to the first carrier voltage application part 315a, the second carrier voltage application part 315b and the third carrier voltage application part 1016, respectively. At this time, the oscillator and clock generation circuit 325 is shared among the plurality of detection units. However, different carrier signal generating DACs 328a, 328b and 1008 are used for the respective detection elements.

Note that, since the carrier signals of the respective detection elements are independent from each other, it is not always necessary that frequencies, amplitudes and phases of the carrier signals are identical, and it is also possible that the frequencies, amplitudes and phases are completely identical even when different carrier signal generating DACs are used.

Since the process of detecting and outputting acceleration by the first and second acceleration detection elements 311a and 311b is identical to that of the first embodiment, descriptions thereof will be omitted.

In the first angular velocity detection element 1013a, upon receiving a clock trigger supplied from the oscillator and clock generation circuit 325, the driving voltage generating DAC 1007 supplies a voltage to the driving electrode 1010 and oscillates the movable part 1014 supported by the support beam 1015. The displacement caused by the oscillation generates a change in capacitance of the monitor electrode 1011. Therefore, a carrier signal generated in the third carrier signal generating DAC 1008 upon similarly receiving a clock trigger supplied from the oscillator and clock generation circuit 325 is applied to the monitor electrode 1011 through the carrier voltage application part 1016, and the change in capacitance of the monitor electrode 1011 is input to the third C/V conversion circuit 1001 in the form of current. Thereafter, the amount of displacement of the monitor electrode 1011 is converted into voltage and is then input to the DSP circuit unit 330 through the third amplifier circuit 1002 and the third ADC 1003. In the DSP circuit unit 330, the input amount of displacement of the monitor electrode 1011 is subjected to synchronous detection at the same frequency as that of the driving voltage output by the driving voltage generating DAC 1007 to obtain phase information and amplitude information of the displacement of the monitor electrode 1011. In response to this, the DSP circuit unit 330 controls the oscillation frequency of the oscillator and clock generation circuit 325 so that the oscillation of the movable part 1014 becomes a resonance frequency of an oscillation system made up of the movable part 1014 and the support beam 1015. Further, the DSP circuit unit 330 controls the output voltage of the driving voltage generating DAC 1007 so that amplitude of oscillation becomes constant. This frequency control can achieve the effect of obtaining maximum amplitude with a low driving voltage, and the amplitude control can achieve the effect of maintaining the Coriolis force occurring at the movable part 1014 due to angular velocity applied to the sensor always constant. It is assumed that the detection of angular velocity is performed in a state in which the resonance frequency control and the amplitude control are being performed.

When an angular velocity is applied to the compound sensor, Coriolis force is generated at the movable part 1014 and the movable part 1014 displaces in an axial direction orthogonal to a vibration axis. Here, similar to the monitor electrode 1011, upon receiving a clock trigger supplied from the oscillator and clock generation circuit 325, the carrier signal generated in the third carrier signal generating DAC 1008 is applied to the detection electrode 1012 through the carrier voltage application part 1016, and the change in capacitance of the detection electrode 1012 is input to the fourth C/V conversion circuit 1004 in the form of current. Thereafter, the amount of displacement is converted into a voltage and is then input to the DSP circuit unit 330 through the fourth amplifier circuit 1005 and the fourth ADC 1006. In the DSP circuit unit 330, the input amount of displacement of the detection electrode 1012 is subjected to synchronous detection at the same frequency as that of the driving voltage output by the driving voltage generating DAC 1007 to obtain amplitude information of the displacement of the detection electrode 1012. In response to this, the DSP circuit unit 330 performs waveform shaping of the amplitude information, namely noise reduction by the LPF and trimming adjustment of zero points or gains, and the applied angular velocity is output to an upper system via communication means, for instance, SPI communication.

Here, the overcurrent switch circuits 101a, 101b, 102a, 102b, 103a, 103b and 104 to 107 mounted to the signal detection LSI have the same configuration as that of the first embodiment. Namely, since short circuits caused at an acceleration detection element and an angular velocity detection element generate a current amount which is different from that of a normal state, the power source voltage of the corresponding detection unit of the element is insulated from other detection units.

Therefore, a defect such as the reduction in reference voltage or the like caused by abnormal current due to short circuit does not spread to the power source voltage, the reference voltage generation circuit 324, the oscillator and clock generation circuit 325, the memory 326 and the DSP circuit unit 330 which are common to the respective acceleration and angular velocity detection units. Accordingly, the defect of a faulty detection element does not spread to other detection units having no fault, and outputs of the detection elements having no fault can be continuously used for the compound sensor.

Since the relationship of the responsiveness of the overcurrent switch circuits 101a, 101b, 102a, 102b, 103a, 103b and 104 to 107 and the sensor output LPF is identical to that of the first embodiment, descriptions thereof will be omitted.

Note that, in the present embodiment, as for the substrate voltage generating DACs 329a, 329b and 1009, respectively independent circuits are provided for the acceleration detection element 311a which is the first detection element, the acceleration detection element 311b which is the second detection element and the angular velocity detection element 1013a which is the third detection element by the circuit to perform the overcurrent detection and the insulation of the corresponding detection unit. With such a configuration, the substrate voltage generating DACs are separately provided so that substrate voltage can be applied in the detection element having no short circuit even when short circuit has occurred in a circuit related to the substrate voltage generating DACs 329a, 329b and 1009. As mentioned in the paragraph of the prior art, the substrate voltage indicates the voltage of the dummy pattern parts 316a, 316b and 1017, and it is generally desirable to provide a function of fixing the voltage to a constant value instead of leaving it in a floating state.

The carrier signal generating DACs 328a, 328b and 1008 are also provided as independent circuits by the circuit to perform the detection of overcurrent and the insulation of the corresponding detection unit for the acceleration detection element 311a, the acceleration detection element 311b and the angular velocity detection element 1013a. With such a configuration, the carrier signal generating DACs are separately provided so that carrier voltage can be applied in the detection element having no short circuit even when short circuit has occurred in a circuit related to the carrier signal generating DACs 328a, 328b and 1008.

Also, the first acceleration detection element 311a, the second acceleration detection element 311b and the first angular velocity detection element 1013a may be fabricated on the same chip as shown in FIG. 9 or fabricated on different chips. In the case where they are respectively fabricated on different chips, since substrate voltages can be independently set, even when a short circuit fault related to the substrate voltage has occurred, the fault does not spread to other detection units. In the case where a plurality of detection elements are fabricated on the same chip, it is desirable to employ a configuration in which substrate voltages are independently set like the case where the detection elements are fabricated on separate chips (FIG. 9). For instance, the method of electrically separating the substrate voltage described in the first embodiment has been known.

Further, in the present embodiment, it is conceivable to employ the configuration in which some difference is intentionally given to the voltages of the detection electrodes 313a, 313b and 1012, the diagnosis electrodes 314a and 314b, the driving electrode 1010, the monitor electrode 1011 and the movable parts 312a, 312b and 1014 and to the DC voltages of the substrate voltages of the dummy pattern parts 316a, 316b and 1017. This is because, since no current flows even when conductive bodies having the same voltage come into contact, fault detection based on current cannot be performed even if the contact is a fault mode. Accordingly, it is conceivable to employ the configuration in which voltages including the substrate voltage are supplied so as to have differences at DC levels in all conductive bodies. At this time, if the voltage difference is large, since influences of parasitic components and electrostatic force become large as described above, it is desirable that the DC voltage difference between electrodes and conductive bodies is small. The voltage difference is not limited to DC components but may also be AC components, and if frequencies thereof are sufficiently higher than response frequencies of the movable parts of the acceleration detection elements 311a and 311b and the angular velocity detection element 1013a, the electrostatic force generated by voltage does not cause the displacement of the movable parts. On the side of the overcurrent switch circuit, current can be detected at high SNR by performing synchronous detection at the same frequencies as those of the AC components of the voltage difference.

<Sensor Output Format in Normal State and at Fault Occurrence>

Sensor output formats in a normal state and at the time of fault occurrence will be described with reference to FIG. 10. FIG. 10 is a diagram showing examples of sensor output formats, and FIG. 10(a) shows a format in a normal state and FIG. 10(b) shows a format at the time of fault occurrence.

When the compound sensor of the present embodiment notifies detected acceleration and angular velocity to an upper system by communication means such as the SPI communication incorporated in the DSP circuit unit 330, a diagnosis flag (DIAG) indicating an operating state of the overcurrent switch circuit is output together with an acceleration output (YG) of the first acceleration detection element 311a, an acceleration output (XG) of the second acceleration detection element 311b and an angular velocity output (YAW) of the first angular velocity detection element 1013a as shown in FIG. 10(a). In this manner, since the upper system can confirm the detection element in which a fault has occurred, it is possible to determine to continue the system functions using the detection element having no fault. Also, by further detecting the fact that the consumption current at the corresponding part is no longer the overcurrent by the stop of power supply after the occurrence of fault, a flag showing the completion of fault handling indicating that the fault part is insulated properly may be output.

At the time of fault occurrence, an output value of the detection element in which the fault has occurred (angular velocity output of the first angular velocity detection element denoted with "YAW" in FIG. 10(b)) may be set to a value outside a normal output range in addition to attaching a diagnosis flag like in FIG. 10(b). In the case of 16 bit output, +32767 and −32768 are examples thereof.

In the example of FIG. 10(b), the diagnosis flag (DIAG) is changed to "0x0404" from "0x0000" in a normal state, and it can be determined from "4" of the first digit that a fault has occurred in the angular velocity detection element 1013a and it can be determined from "4" of the third digit that the angular velocity detection element 1013a is reliably insulated. Further, the angular velocity output (YAW) of the angular velocity detection element 1013a is changed to "0x8000" from "0x0120" in a normal state, and the occurrence of fault can be determined from the value outside the normal range. Note that, since the acceleration output (YG) of the first acceleration detection element 311a remains "0xFE00" equal to that in a normal state and the acceleration output (X_G) of the second acceleration detection element 311b remains "0x0200" equal to that in a normal state, it can be determined that no fault has occurred therein.

By providing the function like this, it is possible to reduce the possibility of erroneously using the acceleration output at the time of occurrence of fault in an upper system.

As described above, in a compound sensor for detecting an acceleration and an angular velocity according to the present embodiment, by collectively putting the outputs of all detection elements detected by the compound sensor and the diagnosis flags indicating presence or absence of overcurrent detection and results of handling into a series of communication frames, an upper system can advantageously reduce the number of communications. Moreover, when being connected to a network to which a large number of nodes are connected such as CAN, it is possible to suppress the congestion of communication.

Note that, since the mounting method of the signal detection LSI is identical to that of the first embodiment, descriptions thereof will be omitted.

Effect of Second Embodiment

According to the present embodiment described above, the following effects can be achieved in a compound sensor realizing the biaxial acceleration detection and the uniaxial angular velocity detection. Namely, also in the present embodiment, by providing overcurrent switch circuits 101a, 101b, 102a, 102b, 103a, 103b and 104 to 107 for respective detection units so that the circuit to perform the detection of overcurrent and the insulation of the corresponding detection unit is formed to have the configuration to stop the power supply to a faulty detection unit when an electric fault such as a short circuit has occurred, it is possible to prevent spread of the fault to other detection units caused by mechanical faults like the first embodiment described above. Further, in view of the fact that the fault occurrence rate of a solid state signal detection LSI 320 is sufficiently low when compared to the fault occurrence rate of the acceleration/angular velocity detection element chip 1013 with a mechanical structure, it is possible to reduce the probability of simultaneous fault occurrence of detection units of the compound sensor.

More precisely, the same effects as those of the above-described first embodiment can be achieved. However, since the uniaxial angular velocity detection element 1013a is added in the configuration example of the present embodiment, the respective effects ((1) to (7)) of the first embodiment can be obtained in the configuration including this angular velocity detection element 1013a and respective components of the signal detection circuits thereof.

In the foregoing, the invention made by the inventors of the present invention has been concretely described based on the embodiments. However, it goes without saying that the present invention is not limited to the foregoing embodiments and various modifications and alterations can be made within the scope of the present invention. For example, the embodiments above have been described in detail so as to make the present invention easily understood, and the present invention is not limited to the embodiment having all of the described constituent elements. Also, a part of the configuration of one embodiment may be replaced with the configuration of another embodiment, and the configuration of one embodiment may be added to the configuration of another embodiment. Furthermore, another configuration may be added to a part of the configuration of each embodiment, and a part of the configuration of each embodiment may be eliminated or replaced with another configuration.

DESCRIPTIONS OF REFERENCE CHARACTERS 101a, 101b, 102a, 102b, 103a, 103b and 104 to 107 Overcurrent switch circuit
201 Signal detection LSI
202 Pad
203 Circuit mounting part
204 Signal processing circuit part
205 Signal processing circuit part
206 Guard ring
207 Substrate part
208 Insulation layer
209 Substrate part
210 SOI substrate
211 Insulation layer
212 MOS transistor
311 Acceleration detection element chip
311a, 311b Acceleration detection element
312a, 312b Movable part
313a, 313b Detection electrode
314a, 314b Diagnosis electrode
315a, 315b Carrier voltage application part
316, 316a, 316b Dummy pattern part
317a, 317b Support beam
320 Signal detection LSI
321a, 321b C/V conversion circuit
322a, 322b Amplifier circuit
323a, 323b ADC
324 Reference voltage generation circuit
325 Oscillator and clock generation circuit
326 Memory
327a, 327b Diagnosis voltage outputting DAC
328a, 328b Carrier signal generating DAC
329a, 329b Substrate voltage generating DAC
330 DSP circuit unit
331 Power source voltage input unit
332 GND voltage input unit
341 Bonding wire
501 Voltage input unit
502 Switch
503 Current detection circuit unit
504 Determination threshold
505 Comparator
506 LPF
507 Fault determination output unit
601 Voltage input unit
602 Switch
603 Current detection circuit unit
604 Determination threshold
605 Comparator
606 Fault determination output unit
607 Driver circuit
701 Operational amplifier
702 Determination threshold
703 Comparator
704 Fault determination output unit
1001 C/V conversion circuit
1002 Amplifier circuit
1003 ADC 1004 C/V conversion circuit
1005 Amplifier circuit
1006 ADC
1007 Driving voltage generating DAC
1008 Carrier signal generating DAC
1009 Substrate voltage generating DAC
1010 Driving electrode
1011 Monitor electrode
1012 Detection electrode
1013 Acceleration/angular velocity detection element chip
1013a Angular velocity detection element
1014 Movable part
1015 Support beam
1016 Carrier voltage application part
1017 Dummy pattern part
2001 Switch
2002 Output terminal
2003 Carrier signal generator
2004 Bias voltage
2005 Operational amplifier

The invention claimed is:

1. A compound sensor for detecting a plurality of physical quantities, the compound sensor comprising:
   a plurality of detection elements;
   a plurality of signal detection circuits provided for processing signals received from the plurality of detection elements;
   a power source shared among each of the plurality of detection elements; and
   a plurality of fault detection circuits provided for each of the plurality of detection elements for detecting a fault of each detection element and stopping power supply to a faulty detection element;
   wherein the plurality of fault detection circuits detect fault occurrence by detecting when a current in the faulty detection element is not at a predetermined value or when the current is larger than a threshold;
   wherein the signal detection circuits includes a low-pass filter for removing noise; and
   wherein a response time from detection of a fault of each detection element to stop of power supply to the detection element in which the fault has occurred in each of the plurality of signal detection circuits is shorter than a time constant of the low-pass filter.

2. The compound sensor according to claim 1,
   wherein the plurality of detection elements include first and second acceleration detection elements for detecting biaxial acceleration.

3. The compound sensor according to claim 1, further comprising:
   a reference voltage generation circuit and a clock generation circuit shared among each of the plurality of detection elements,
   wherein each of the plurality of fault detection circuits has a buffer circuit, and
   at least one of a voltage signal of the reference voltage generated by the reference voltage generation circuit and a clock voltage signal generated by the clock generation circuit is supplied to each of the signal detection circuits through each of the plurality of buffer circuits.

4. The compound sensor according to claim 3,
   wherein each of the plurality of fault detection circuits monitors change in consumption current of the buffer circuit, determines a fault of a detection element when the consumption current is not at a predetermined current value, and stops power supply to the detection element in which the fault has occurred.

5. The compound sensor according to claim 1, further comprising:
   a communication circuit which notifies by an output communication frame that each of the plurality of fault detection circuits has stopped supplying power to the detection element in which the fault has occurred.

6. The compound sensor according to claim 5,
   wherein the output communication frame contains contents to notify that power supply to the detection element in which the fault has occurred has been stopped and output values of the plurality of detection elements.

7. The compound sensor according to claim 1,
   wherein each of the plurality of detection elements includes movable parts, electrodes and dummy pattern parts, and
   a voltage of the dummy pattern parts differs from any one of voltages of the movable parts and the electrodes.

* * * * *